United States Patent [19]
Itoi

[11] Patent Number: 6,014,356
[45] Date of Patent: Jan. 11, 2000

[54] DATA-REPRODUCING DEVICE

[75] Inventor: Satoshi Itoi, Tokyo, Japan

[73] Assignee: NEC Corporation, Japan

[21] Appl. No.: 08/943,327

[22] Filed: Oct. 3, 1997

[30] Foreign Application Priority Data

Oct. 4, 1996 [JP] Japan .................................. 8-282959

[51] Int. Cl.⁷ .................................................. G11B 7/00
[52] U.S. Cl. .......................................................... 369/59
[58] Field of Search ................................ 369/124, 59, 54, 369/58, 47, 48, 49

[56] References Cited

U.S. PATENT DOCUMENTS 5,689,532  11/1997  Fitzpatrick .................................. 369/59
5,809,071  9/1994  Kobayashi et al. ........................ 369/59

FOREIGN PATENT DOCUMENTS 4-298865  10/1992  Japan .

Primary Examiner—Nabil Hindi
Attorney, Agent, or Firm—Ostrolenk, Faber, Gerb & Soffen, LLP

[57] ABSTRACT

Disclosed is a data-reproducing device which has: means for calculating a subtraction absolute value from a pre-equalized reproduction data and an estimation data and outputting the subtraction absolute value as a branchmetric; means for comparing values that the branchmetric and a previously calculated pathmetric are added, selecting a smaller one of the values as the result of comparing, and outputting the smaller one of the values as a new pathmetric as well as a selection signal as to which of the values is selected; a path memory circuit which stores the selection signal preferably over several stages or tens of stages, obtaining a most possible path by unifying paths, then outputting a most possible data; a storage means for outputting an estimation data judged to be closest to the pre-equalized reproduction data by using a present output of the path memory circuit as an address; and a data correcting means for renewing an internal data of the storage means based upon a data obtained by delaying the pre-equalized reproduction data by a predetermined value and the internal data of the storage means obtained by using a continuous output data of the path memory circuit.

84 Claims, 35 Drawing Sheets

FIG.11

| DATA | ADDRESS | DATA | ADDRESS |
|---|---|---|---|
| RM(0) | 00 0000<br>10<br>21 | RM(8) | 00 1210<br>10 |
| RM(1) | 00 0001<br>10<br>21 | RM(9) | 00 1222<br>10 |
| RM(2) | 00 0012<br>10<br>21 | RM(10) | 00 1222<br>10 |
| RM(3) | 00 0121<br>10<br>21 | RM(11) | 00 2100<br>12<br>22 |
| RM(4) | 00 0122<br>10<br>21 | RM(12) | 01 2101<br>12<br>22 |
| RM(5) | 12 1000<br>22 | RM(13) | 01 2210<br>12<br>22 |
| RM(6) | 12 1001<br>22 | RM(14) | 01 2221<br>12<br>22 |
| RM(7) | 12 1002<br>22 | RM(15) | 01 2222<br>12<br>22 |

DATA-REPRODUCING DEVICE

FIELD OF THE INVENTION

This invention relates to a data-reproducing device, and more particularly to, a data-reproducing device used in a digital recording device where digital data or data of digital image, voice or system are recorded in a disk medium, such as an opto-magnetic disk, phase-variable disk and magnetic disk or a magnetic tape medium.

BACKGROUND OF THE INVENTION

Conventionally, in a digital recording disk device, digital recording VTR etc., data are, without recording the data as they are, recorded after converting into a recording code. A 1,7 code and a 2,7 code are typical recording codes.

In the 1,7 code, after a data bit of two bits is converted into a channel bit of three bits or a data bit of four bits is converted into a channel bit of six bits, it is recorded by using a NRZI rule. The NRZI rule is a recording rule that inversion is conducted by "1" and non-inversion is conducted by "0". A big characteristic of the 1,7 code is that there exists "0" of one or more and 7 or less between "1" and "1" after converting, i.e., a minimum inversion interval is 2.

In the 2,7 code, after a data bit of two bits is converted into a channel bit of four bits or a data bit of four bits is converted into a channel bit of six bits, it is recorded by using a NRZI rule. A big characteristic of the 2,7 code is that there exists "0" of two or more and 7 or less between "1" and "1" after converting, i.e., a minimum inversion interval is 3.

On the other hand, a method has been suggested where, to a reproduction signal, detection of data is conducted by using a combination of a partial response equalization system and a Viterbi decoding. For example, this method is disclosed in Japanese patent application laid-open No. 4-298865 (1992) (application No. 3-64201 (1991) titled "Reproduction Data Detecting System".

In this reproduction data detecting system, a code with a minimum inversion interval of 2, such as a 1,7 code is recorded. In reproducing, a bit error correction process is conducted by converting a reproduction signal into a ternary data by PR(1,1) equalization and then decoding it by four-state Viterbi decoding to reduce an error rate.

However, in the conventional method of detecting data by the combination of partial response equalization and Viterbi decoding, there is a problem that a reproduction-adaptive process cannot be performed, whereas a bit error correction process is conducted to reduce an error rate.

Namely, in PR(1,1) equalization, a fixed equalization is always carried out even when a change in reproduction signal due to a variation in recording current when recording, a variation in medium characteristics caused by a recording device, a variation in recording and reproducing characteristics caused by temperature or the like occurs. Therefore, equalization characteristics cannot follow the change in reproducing signal.

SUMMARY OF THE INVENTION

Accordingly, it is an object of the invention to provide a data-reproducing device where follow-up equalization and detection can be conducted even when pre-equalization characteristics are varied and further an error rate can be reduced to an optimum value by bit error correction.

According to the invention, a data-reproducing device, comprises:

means for calculating a subtraction absolute value from a pre-equalized reproduction data and an estimation data and outputting the subtraction absolute value as a branchmetric;

means for comparing values that the branchmetric and a previously calculated pathmetric are added, selecting a smaller one of the values as the result of comparing, and outputting the smaller one of the values as a new pathmetric as well as a selection signal as to which of the values is selected;

a path memory circuit which stores the selection signal preferably over several stages or tens of stages, obtaining a most possible path by unifying paths, then outputting a most possible data;

a storage means for outputting an estimation data judged to be closest to the pre-equalized reproduction data by using a present output of the path memory circuit as an address; and a data correcting means for renewing an internal data of the storage means based upon a data obtained by delaying the pre-equalized reproduction data by a predetermined value and the internal data of the storage means obtained by using a continuous output data of the path memory circuit.

BRIEF DESCRIPTION OF THE DRAWINGS

The invention will be explained in more detail in conjunction with the appended drawings, wherein:

FIG. 11 is a table showing a list of RAM addresses in the first embodiment.

DESCRIPTION OF THE PREFERRED EMBODIMENTS

A data-reproducing device in the first preferred embodiment will be explained in FIGS. 1 to 11.

Figure 1:
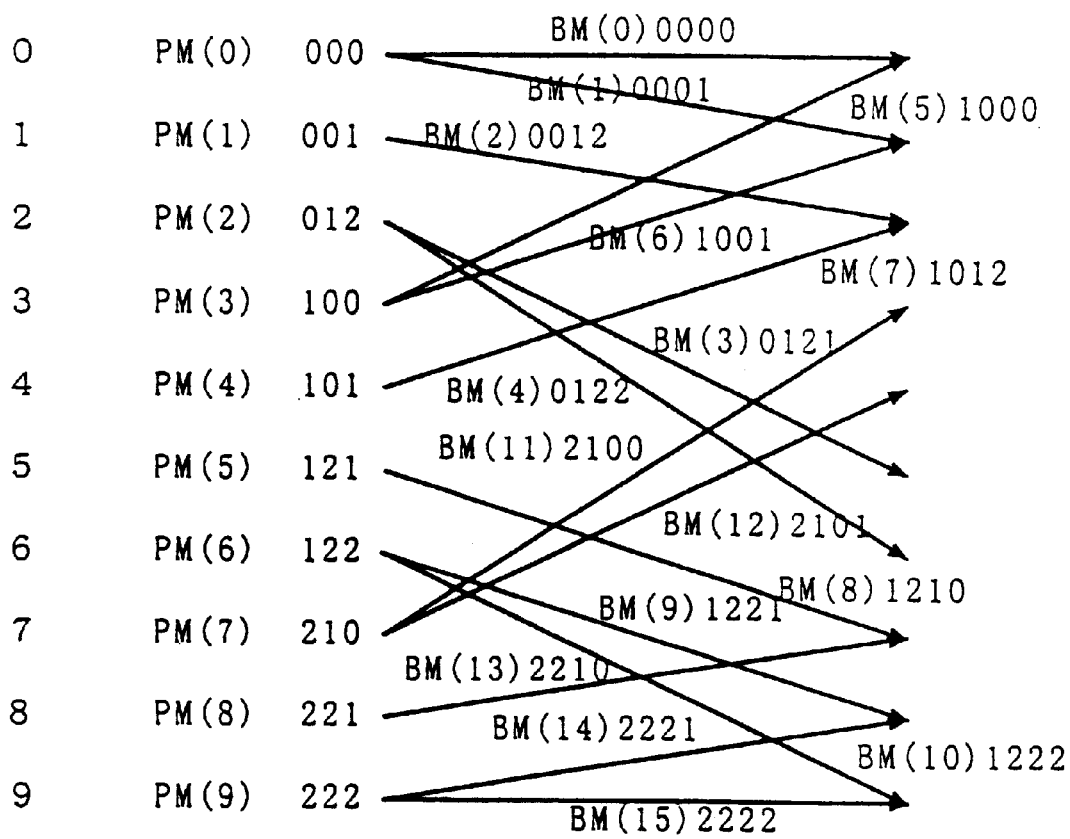
FIG. 1 is a diagram showing a state change with a minimum inversion interval of 2 and four clock data.

FIG. 1 shows a state change where a reproduction data in which a code with a minimum inversion interval of 2 is recorded is converted into a ternary data(0,1,2) by PR(1,1) equalization and four-clock data is considered.

In FIG. 1, an arrow is called 'path' and a position targeted by an arrow is called 'state'. Also, a negative logarithm of probability is call 'metric'.

In coding with a minimum inversion interval of 2, there are characteristics that two or more bits of "1" do not continue, "1" always exists between "0" and "2" or "2" and "0" and a sequence of "0" then "1" is always followed by "2", and a sequence of "2" then "1" is always followed by "0".

Therefore, four-clock continuous data, which are paths reaching time n, consist of sixteen patterns of:

0000, 0001, 0012, 0121, 0122, 1000, 1001, 1012, 1210, 1221, 1222, 2100, 2101, 2210, 2221, 2222.

Herein, negative logarithms of probabilities that inputs correspond to the above respective continuous data are called 'branchmetric' and are represented by BM(0) to BM(15) along the order of them.

Also, four-clock continuous data, which are paths reaching time n+1, consist of sixteen patterns of:

0000, 0001, 0012, 0121, 0122, 1000, 1001, 1012, 1210, 1221, 1222, 2100, 2101, 2210, 2221, 2222.

Here, between the four-clock continuous data to reach time n and the four-clock continuous data to reach time n+1, common three-clock parts are of ten patterns of:

000, 001, 012, 100, 101, 121, 122, 210, 221, 222.

Negative logarithms of probabilities to reach these ten states are called 'pathmetric' and are represented by PM(0) to BM(9) along the order of them.

TABLE 1

| | | |
|---|---|---|
| BM(0)0000 | →PM(0)000 | →BM(0)0000, or BM(1)0001 |
| BM(1)0001 | →PM(1)001 | →BM(2)0012 |
| BM(2)0012 | →PM(2)012 | →BM(3)0121, or BM(4)0122 |
| BM(3)0121 | →PM(5)121 | →BM(8)1210 |
| BM(4)0122 | →PM(6)122 | →BM(9)1221, or BM(10)1222 |
| BM(5)1000 | →PM(0)000 | →BM(0)0000, or BM(1)0001 |
| BM(6)1001 | →PM(1)001 | →BM(2)0012 |
| BM(7)1012 | →PM(2)012 | →BM(3)0121, or BM(4)0122 |
| BM(8)1210 | →PM(7)210 | →BM(11)2100, or BM(12)2101 |
| BM(9)1221 | →PM(8)221 | →BM(13)2210 |
| BM(10)1222 | →PM(9)222 | →BM(14)2221, or BM(15)2222 |
| BM(11)2100 | →PM*3)100 | →BM(5)1000, or BM(6)1001 |
| BM(12)2101 | →PM(4)101 | →BM(7)1012 |
| BM(13)2210 | →PM(7)210 | →BM(11)2100, or BM(12)2101 |
| BM(14)2221 | →PM(8)221 | →BM(13)2210 |
| BM(15)2222 | →PM(9)222 | →BM(14)2221, or BM(15)2222 |

In Table 1, for example, in the first row, branchmetric BM(0) is a metric of "0000", pathmetric PM(0) at time n is a metric of "000" that "0" at the left end corresponding to the oldest past of BM(0) is deleted, thereafter, at time n+1, it changes into "0000" for BM(0) or "0001" for BM(1) by adding "0" or "1" at the right end since "0" or "1" needs to follow "000". Also, for example, in the second row, branchmetric BM(1) is a metric of "0001", pathmetric PM(1) at time n is a metric of "001" that "0" at the left end corresponding to the oldest past of BM(1) is deleted, thereafter, at time n+1, it changes into "0012" for BM(2) by adding "2" at the right end since only "2" needs to follow "001".

Like meanings are also provided with the third to sixteenth rows.

Next, in FIG. 1, a pathmetric at each state is obtained by selecting smaller one of addition values of a pathmetric at one clock before and a branchmetric(s) from this pathmetric at one clock before to the pathmetric concerned. Namely, it is obtained according to equation 1:

$$PM(0)=\min[PM(0)+BM(0), PM(3)+BM(5)]$$

$$PM(1)=\min[PM(0)+BM(1), PM(3)+BM(6)]$$

$$PM(2)=\min[PM(1)+BM(2), PM(4)+BM(7)]$$

$$PM(3)=PM(7)+BM(11)$$

$$PM(4)=PM(7)+BM(12)$$

$$PM(5)=PM(2)+BM(3)$$

$$PM(6)=PM(2)+BM(4)$$

$$PM(7)=\min[PM(5)+BM(8), PM(8)+BM(13)]$$

$$PM(8)=\min[PM(6)+BM(9), PM(9)+BM(14)]$$

$$PM(9)=\min[PM(6)+BM(10), PM(9)+BM(15)] \quad (1)$$

where a right-hand pathmetric has a value one clock older than a left-hand pathmetric.

Thus, a pathmetric is calculated to select a path, a survival path is continued in an arrow form and a six-bit estimation data at each path is obtained.

Figure 2:
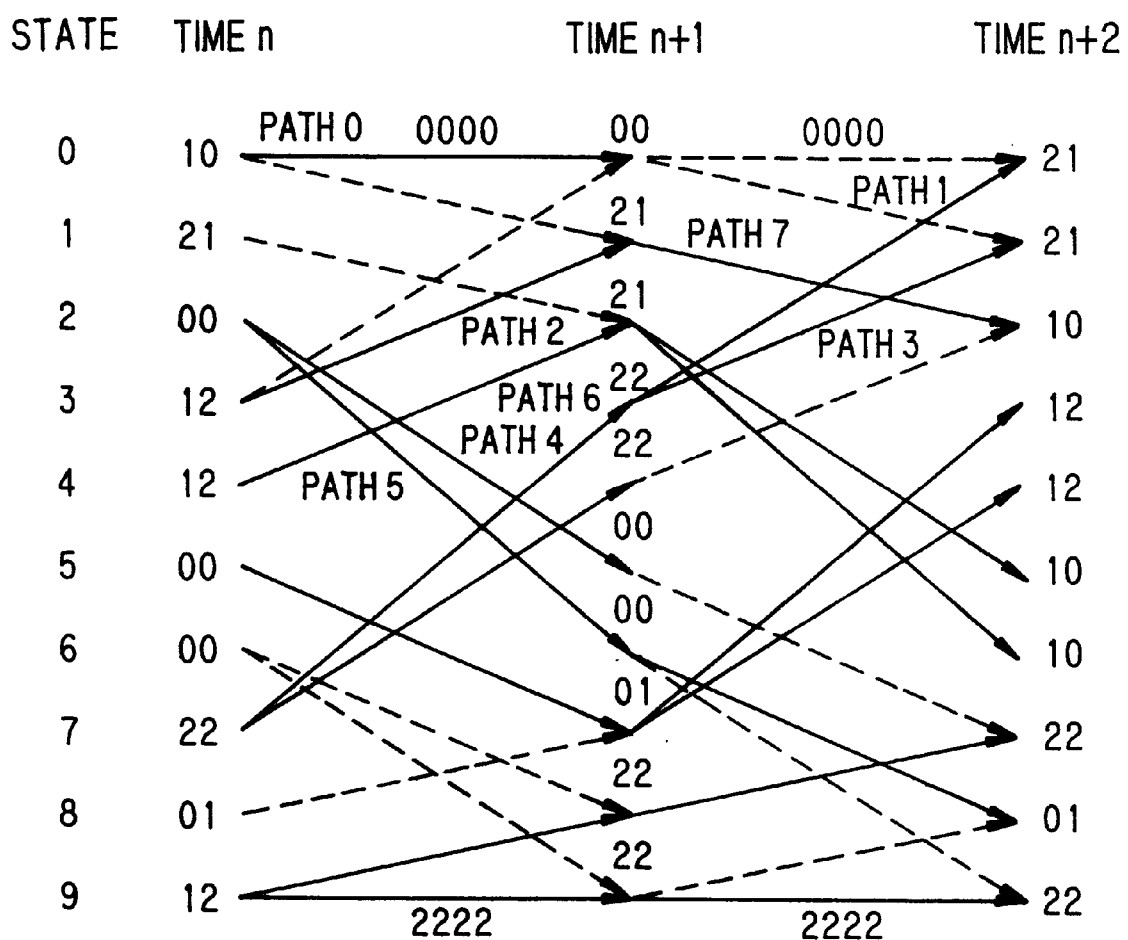
FIG. 2 is a diagram showing a state change where paths are selected extending by two clocks from those in FIG. 1.

FIG. 2 shows a case that paths by two clocks are selected. In FIG. 2, a full line means a selected and surviving path, and a dotted line means a path which is not selected. Also, two-clock ternary level data other than four-clock data "0000" and "2222" are ternary level values until reaching its state. The above-mentioned six-bit estimation data means a two-bit ternary level value until reaching its state and a four-bit survival path branchmetric data.

In state 0, at time n, where it is reached from a ternary level of "10" and thereafter followed by "0000", "100000" is obtained by combining these. This is a six-bit estimation data corresponding to a survival path 0. At time n+1, it is reached from first and second bits "00" of "00000" which is given by shifting "100000" by one bit to the left and thereafter does not follow anywhere. At time n+2, where it is reached from first and second bits "22" of "22100" which is given by shifting by one bit to the left "222100" which is obtained by combining "22" of time n/state 7 and "2100" to reach from there to time n+1/state 3 and thereafter followed by "1000", "221000" is obtained. This is a six-bit estimation data corresponding to a survival path 1.

In state 1, at time n, where it is reached from a ternary level of "21" and thereafter does not follow anywhere. At time n+1, where it is reached from "12" of time n/state 3 and thereafter followed by "1001", "121001" is obtained. This is a six-bit estimation data corresponding to a survival path 2. At time n+2, where it is reached from first and second bits "22" of "22100" which is given by shifting by one bit to the left "222100" which is obtained by combining "22" of time n/state 7 and "2100" to reach from there to time n+1/state 3 and thereafter followed by "1001", "221001" is obtained. This is a six-bit estimation data corresponding to a survival path 3.

In state 2, at time n, where it is reached from a ternary level of "00" and thereafter followed by "0121", "0122", "000121" and "000122" are obtained. These are six-bit estimation data corresponding to survival paths 4, 5. At time n+1, where it is reached from "12" of time n/state 4 and thereafter followed by "1012", "121012" is obtained. This is a six-bit estimation data corresponding to a survival path 6. At time n+2, where it is reached from first and second bits "21" of "21001" which is given by shifting by one bit to the left "121001" which is obtained by combining "12" of time n/state 3 and "1001" to reach from there to time n+1/state 2 and thereafter followed by "0012", "210012" is obtained. This is a six-bit estimation data corresponding to a survival path 7.

Also, in states 3 to 9, six-bit estimation data are similarly obtained.

A branchmetric is given by calculating the absolute value of a difference value between an input estimation signal and a pre-equalized real input data.

Figure 3:
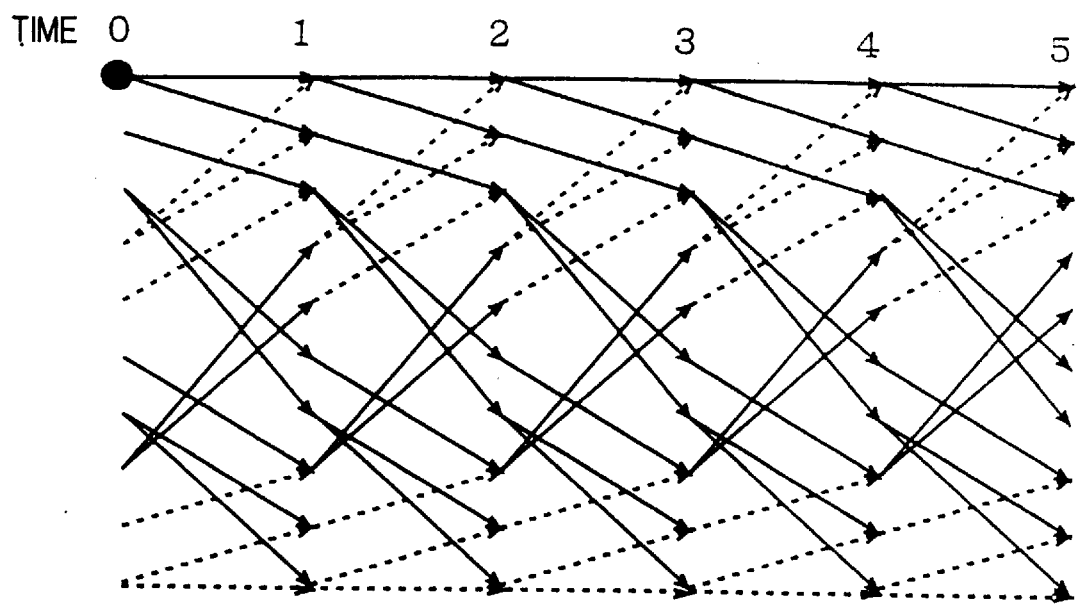
FIG. 3 is a diagram showing a state change where paths are selected extending by further several clocks from those in FIG. 2.

FIG. 3 shows a case that paths are further continued by several clocks as compared with the case in FIG. 2.

As show in FIG. 3, when selection of a path is conducted, paths can be unified to the past state. In FIG. 3, paths are unified to state 0 indicated by ●. Namely, to all states at time 5, paths are reaching from ●(state 0) at time 0.

When paths are unified to the past states 0, 1 and 2 at time n, it is judged that a ternary level at that time is "0". When paths are unified to the past states 3, 4, 5 and 6 at time n, it is judged that a ternary level at that time is "1". When paths are unified to the past states 7, 8 and 9 at time n, it is judged that a ternary level at that time is "2".

Also, a binary output "0" is given to ternary levels of "0", "2", and a binary output "1" is given to a ternary level of "1". An obtained binary output, " . . . 00100101000010001 . . . ", is a NRZ data before decoding a 1,7 code.

Next, the whole composition of a data-reproducing device in the embodiment of the invention will be explained in FIG. 4.

An input data is formed into a ternary data by PR(1,1) pre-equalization(not shown). Also, from RAM 104, input data estimation values to be estimated from six-clock data composed of a four-clock path and a previous two-clock data are input by 16 samples corresponding to the number of branchmetrics.

A subtraction absolute value circuit 101 gives a branchmetric by calculating an absolute value from a difference, i.e., a subtraction value between an input data and the input data estimation value. The subtraction absolute value circuit 101 outputs 16 samples of subtraction absolute value calculation results(branchmetrics).

A comparison and selection circuit 102 compares addition values of a pathmetric and a branchmetric at one clock before and selects a smaller one, and calculates a pathmetric for a new clock.

The comparison and selection circuit 102 outputs a comparison and selection signal to a path memory 103, and outputs the pathmetric for the new clock to the subtraction absolute value circuit 101.

The path memory 103 stores several ten stages of six-bit comparison and selection signals input from the comparison and selection circuit 102, and examines path unification from those values and generates a RAM address to output an input data estimation value which is stored in RAM 104 for the comparison with an input data.

RAM 104 is a memory to store input data estimation values to be estimated from six-clock data composed of a four-clock path and a previous two-clock data, and a preset value is first corrected by a RAM data correcting circuit 105.

The RAM data correcting circuit 105 calculates an input data estimation value from a timed input data and an input data estimation value to be estimated from six-clock data composed of a four-clock path and a previous two-clock data, and renews RAM data.

Next, an example of a composition of the subtraction absolute value circuit 101 and comparison and selection circuit 102 will be explained in FIGS. 5 and 6. Meanwhile, it is shown dividing into FIGS. 5 and 6 for the convenience of drawing.

Figure 5:
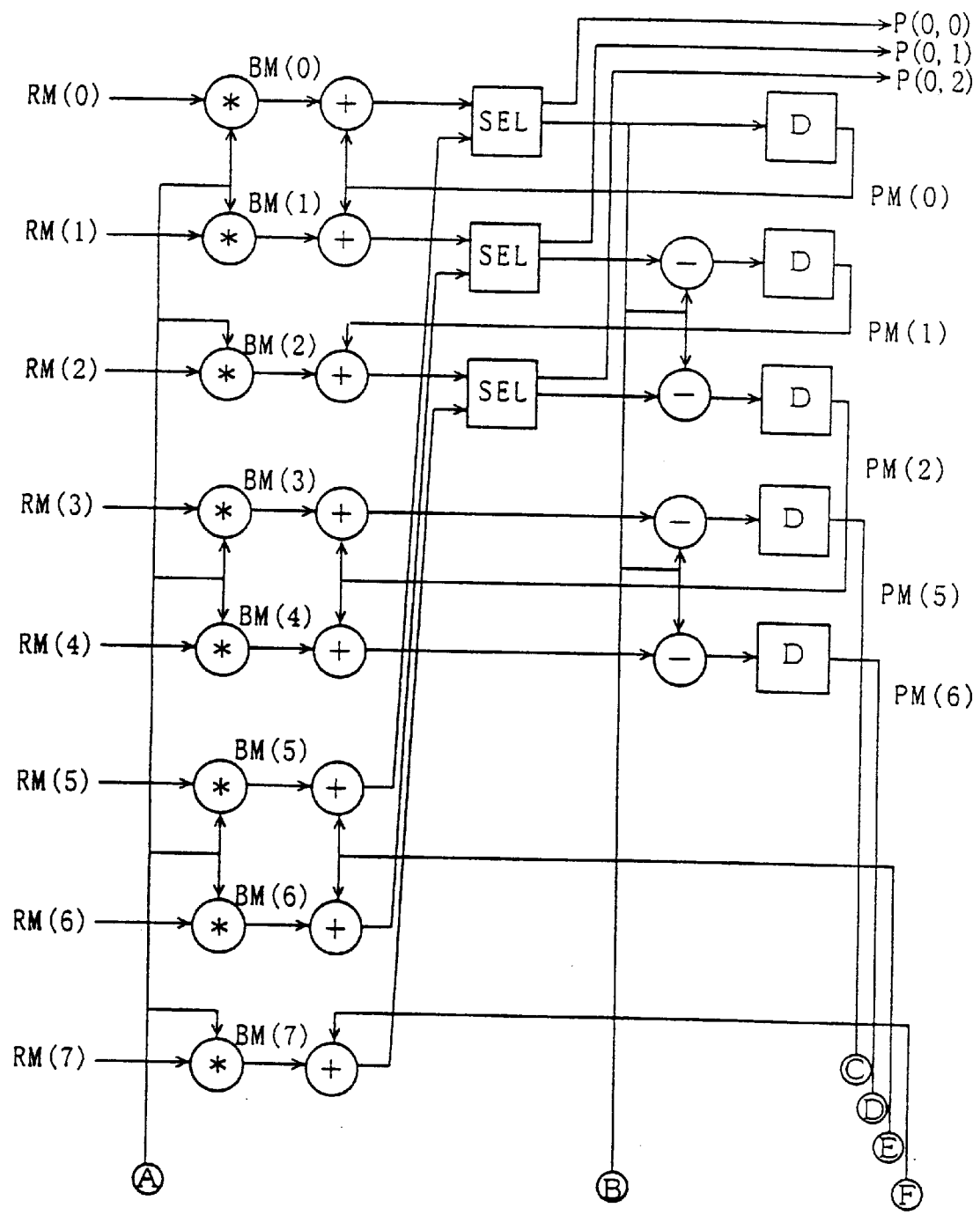
FIGS. 5 and 6 are block diagrams showing examples of a subtraction absolute circuit and a comparison and selection circuit in the first embodiment.
Figure 6:
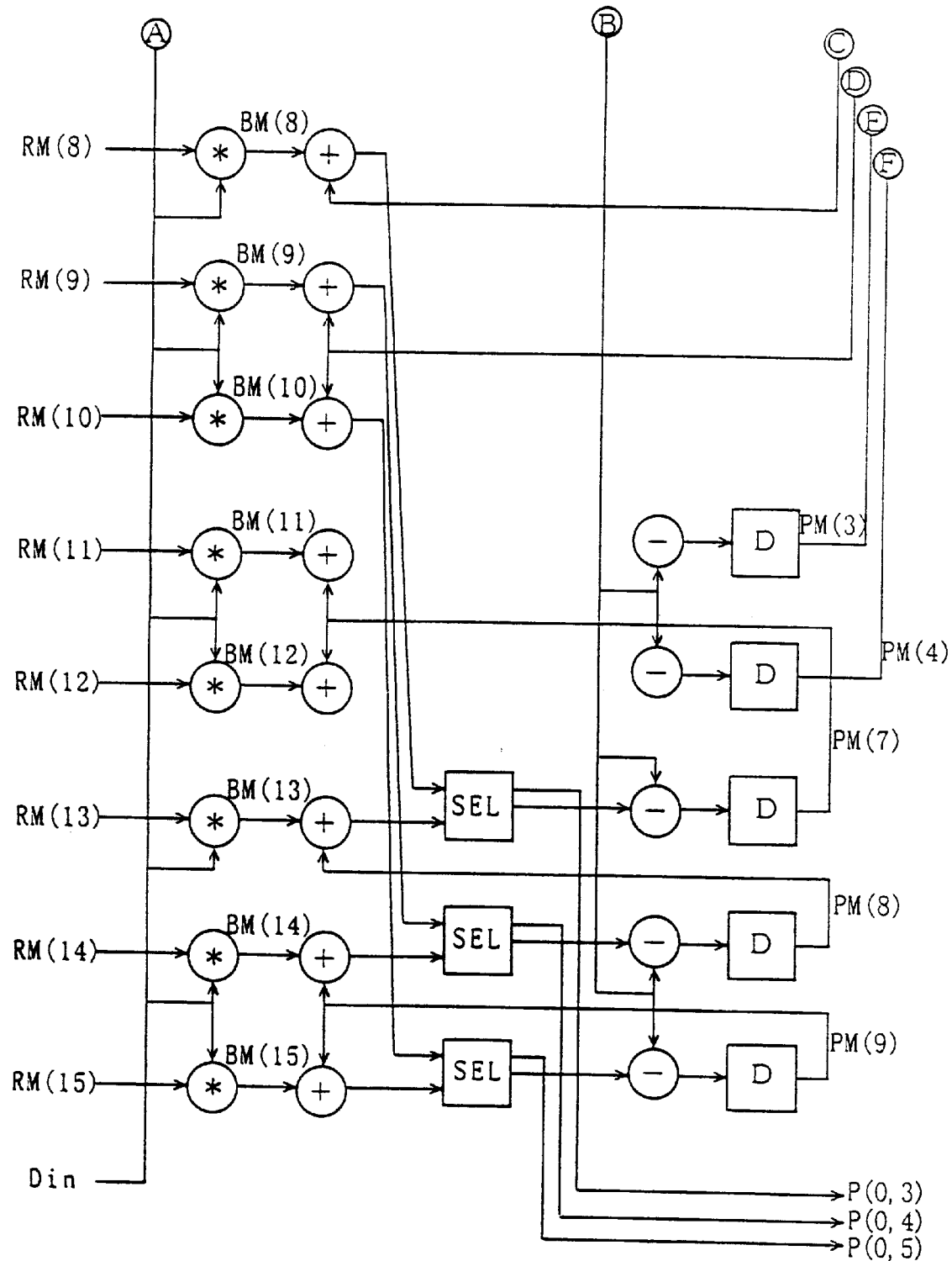

Referring to FIGS. 5 and 6, Din represents an input data that is formed into a ternary data by PR(1,1) pre-equalization, and RM(0) to RM(15) represent input data estimation values, which are stored in RAM 104, to be estimated from six-clock data composed of a four-clock path and a previous two-clock data.

Namely, from RAM 104, estimation values corresponding to RM(0) to RM(15) are read out by using six-bit estimation data obtained by adding previous two-bit data to all four-bit paths "0000" to "1111" as their addresses.

In the subtraction absolute value circuit 101, RM(0) to RM(15) are individually subtracted from Din, and their absolute values are individually calculated, thereby obtaining branchmetrics BM(0) to BM(15) . In FIGS. 5 and 6, a mark '*' represents an operational circuit where a subtraction circuit and a absolute value calculating circuit are combined.

In the comparison and selection circuit 102, at first, from branchmetrics BM(0) to BM(15) and PM(0) to PM(9), the following calculations (2) are conducted:

$$PM(0)+BM(0), PM(0)+BM(1), PM(1)+BM(2),$$

$$PM(2)+BM(3), PM(2)+BM(4),$$

$$PM(3)+BM(5), PM(3)+BM(6), PM(4)+BM(7),$$

$$PM(5)+BM(8), PM(6)+BM(9), PM(6)+BM(10),$$

$$PM(7)+BM(11), PM(7)+BM(12),$$

$$PM(8)+BM(13), PM(9)+BM(14), PM(9)+BM(15) \qquad (2)$$

Next, the following calculation (3) are conducted:

$$PM(0)=\min[PM(0)+BM(0), PM(3)+BM(5)]$$
$$PM(1)=\min[PM(0)+BM(1), PM(3)+BM(6)]$$
$$PM(2)=\min[PM(1)+BM(2), PM(4)+BM(7)]$$
$$PM(3)=PM(7)+BM(11)$$
$$PM(4)=PM(7)+BM(12)$$
$$PM(5)=PM(2)+BM(3)$$
$$PM(6)=PM(2)+BM(4)$$
$$PM(7)=\min[PM(5)+BM(8), PM(8)+BM(13)]$$
$$PM(8)=\min[PM(6)+BM(9), PM(9)+BM(14)]$$
$$PM(9)=\min[PM(6)+BM(10), PM(9)+BM(15)] \quad (3)$$

As shown in the above equations (3), regarding PM(3) to PM(6) the addition results are used as they are, and, regarding PM(0) to PM(2) and PM(7) to PM(9), the numerical comparison is conducted, where a smaller one is selected to give a new pathmetric. Simultaneously, six-bit selection signals are, as shown in FIGS. 5 and 6, output as survival path informations of P(0,0), P(0,1), P(0,2), P(0,7), P(0,8), P(0,9), where a first term and a second term in a parenthesis represent time and state number, respectively.

In states 0 to 9, when a path coming from upward is selected, i.e., when a left-hand term is selected in minimum judgement as to PM(0) to PM(15), survival path information is "0", and, when a path coming from downward is selected, i.e., when a right-hand term is selected in minimum judgement as to PM(0) to PM(15), survival path information is "1".

Also, regarding PM(0) to PM(15), where relative values are important, for example, PM(0) is subtracted from all the path memories to prevent its overflow.

Next, a composition of the path memory circuit 103 will be explained in FIG. 7.

Figure 7:
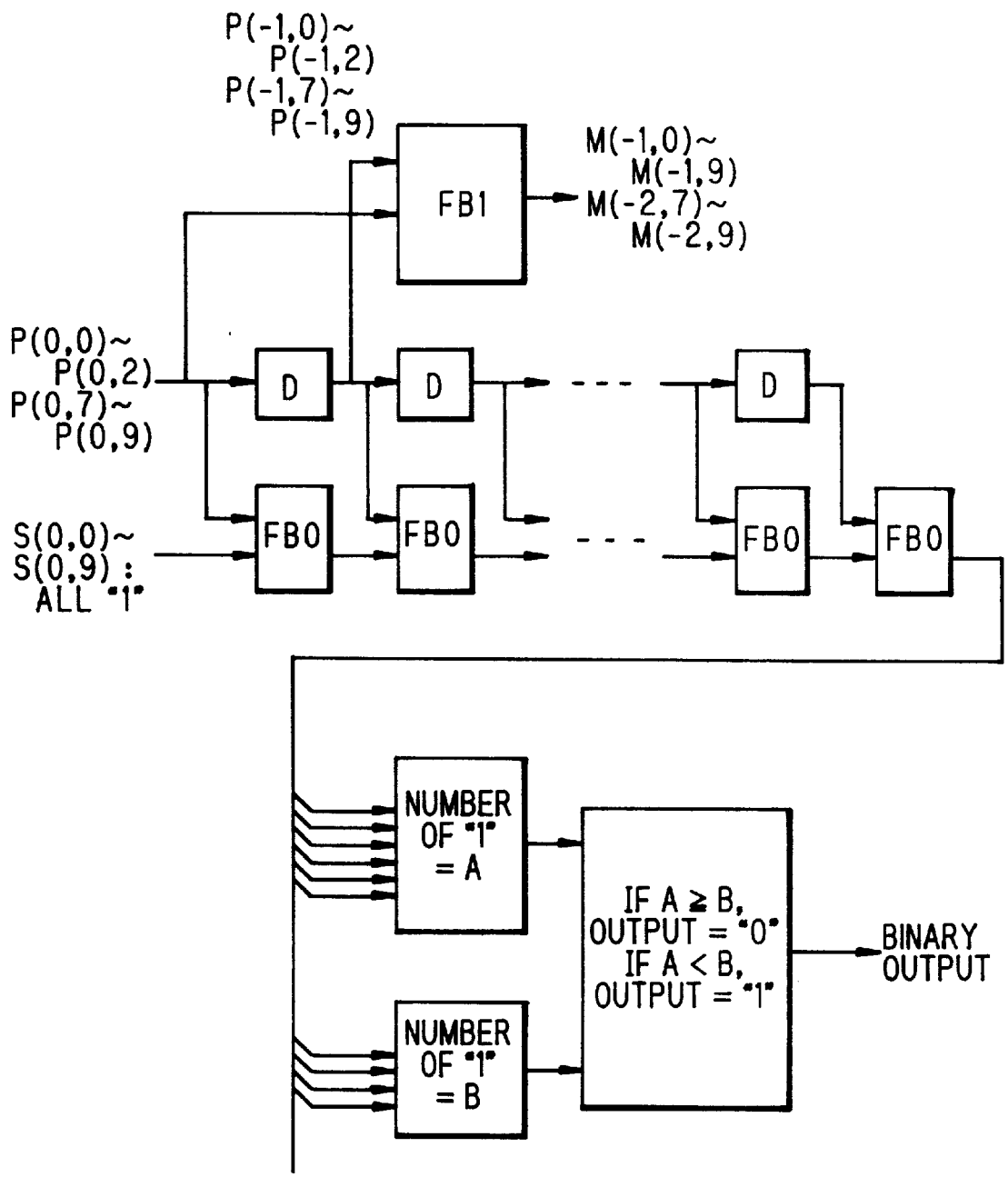
FIG. 7 is a block diagram showing an example of a path memory circuit in the first embodiment.

Referring to FIG. 7, the path memory circuit 103 is composed of D-type flip-flops(D) and function blocks FB0 and FB1. The function block FB0 is a circuit for judging whether paths are unified at the pastest time from the present and tens of clocks of past selection signals. Also, FB1 is a circuit for calculating previous two-bit data to all four-bit paths "0000" to "1111".

Next, an example of a composition of the function block FB0 will be explained in FIGS. 8 and 9. Meanwhile, it is shown dividing into FIGS. 8 and 9 for the convenience of drawing.

Ten-bit survival state informations are represented by S(n+1,0) to S(n+1,9) and S(n,0) to S(n,9). Also, the above-mentioned six-bit survival path informations are represented by P(n+1,0) to P(n+1,2) and P(n+1,7) to P(n+1,9).

In states 0 to 9, survival state information is "1" when there is a possibility of reaching its state, and survival state information is "0" when there is no possibility. Also, in states 0 to 9, when a path coming from upward is selected, i.e., when a left-hand term is selected in minimum judgement as to PM(0) to PM(15), survival path information is "0", and, when a path coming from downward is selected, i.e., when a right-hand term is selected in minimum judgement as to PM(0) to PM(15), survival path information is "1".

Referring to FIG. 2, the survival state information and survival path information will be explained below.

At time n+2, there are possibilities of reaching all states 0 to 9. Therefore, S(n+2,0) to S(n+2,9) are all "1". Next, in states 0 to 2, paths to reach the respective states, i.e., arrows coming from downward, downward and upward in due order are selected, and, in states 7 to 9, arrows coming from downward, upward and downward in due order are selected. Therefore, P(n+2,0) to P(n+2,2) and P(n+2,7) to P(n+2,9) are represented by "110101".

At time n+1, viewing from time n+2, there are possibilities of reaching states 1, 2, 3, 6, 7, 8 and 9, and there is no possibility of reaching states 0, 4 and 5. Therefore, S(n+1,0) to S(n+1,9) are represented by "0111001111" in due order.

Next, in states 0 to 2, paths to reach the respective states, i.e., arrows coming from upward, downward and downward in due order are selected, and, in states 7 to 9, arrows coming from upward, downward and downward in due order are selected. Therefore, P(n+1,0) to P(n+1,2) and P(n+1,7) to P(n+1,9) are represented by "011011".

At time n, viewing from time n+1, there are possibilities of reaching states 0, 2, 3, 4, 5, 7 and 9, and there is no possibility of reaching states 1, 6 and 8. On the other hand, viewing from time n+2, there are possibilities of reaching states 2, 3, 4, 5, 7 and 9, and there is no possibility of reaching states 0, 1, 6 and 8. Therefore, S(n,0) to S(n,9) are represented by "0011110101" in due order.

These relations are represented by:

$$S(n, 0) = [S(n+1, 0) \&\& \overline{P(n+1, 0)}] \,||\, \quad (4)$$
$$[S(n+1, 1) \&\& \overline{P(n+1, 1)}]$$
$$S(n, 1) = S(n+1, 2) \&\& \overline{P(n+1, 2)}$$
$$S(n, 2) = S(n+1, 5) \,||\, S(n+1, 6)$$
$$S(n, 3) = [S(n+1, 0) \&\& P(n+1, 0)] \,||\,$$
$$[S(n+1, 1) \&\& P(n+1, 1)]$$
$$S(n, 4) = S(n+1, 2) \&\& P(n+1, 2)$$
$$S(n, 5) = S(n+1, 7) \&\& \overline{P(n+1, 7)}$$
$$S(n, 6) = [S(n+1, 8) \&\& \overline{P(n+1, 8)}] \,||\,$$
$$[S(n+1, 9) \&\& \overline{P(n+1, 9)}]$$
$$S(n, 7) = S(n+1, 3) \&\& P(n+1, 4)$$
$$S(n, 8) = S(n+1, 7) \&\& P(n+1, 7)$$
$$S(n, 9) = [S(n+1, 8) \&\& P(n+1, 8)] \,||\,$$
$$[S(n+1, 9) \&\& P(n+1, 9)]$$

Figure 8:
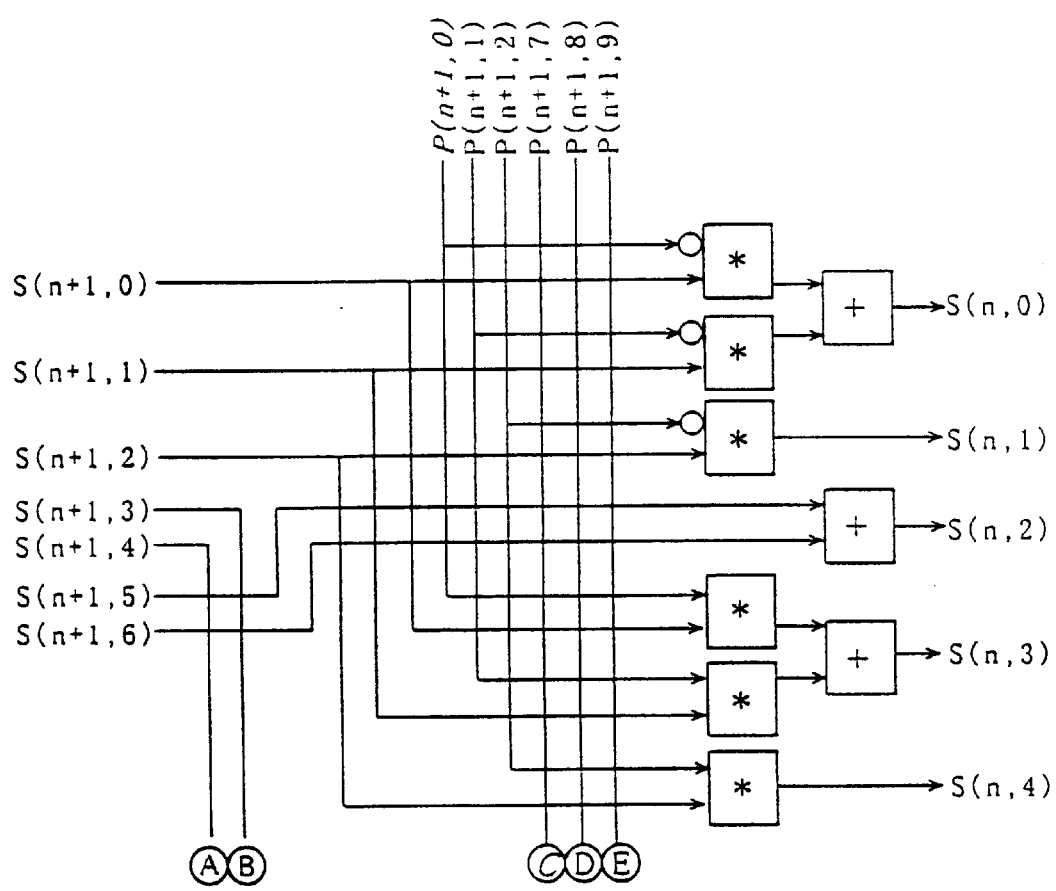
FIGS. 8 and 9 are block diagrams showing an example of a function block FB0 and survival state information calculating circuit in the first embodiment.
Figure 9:
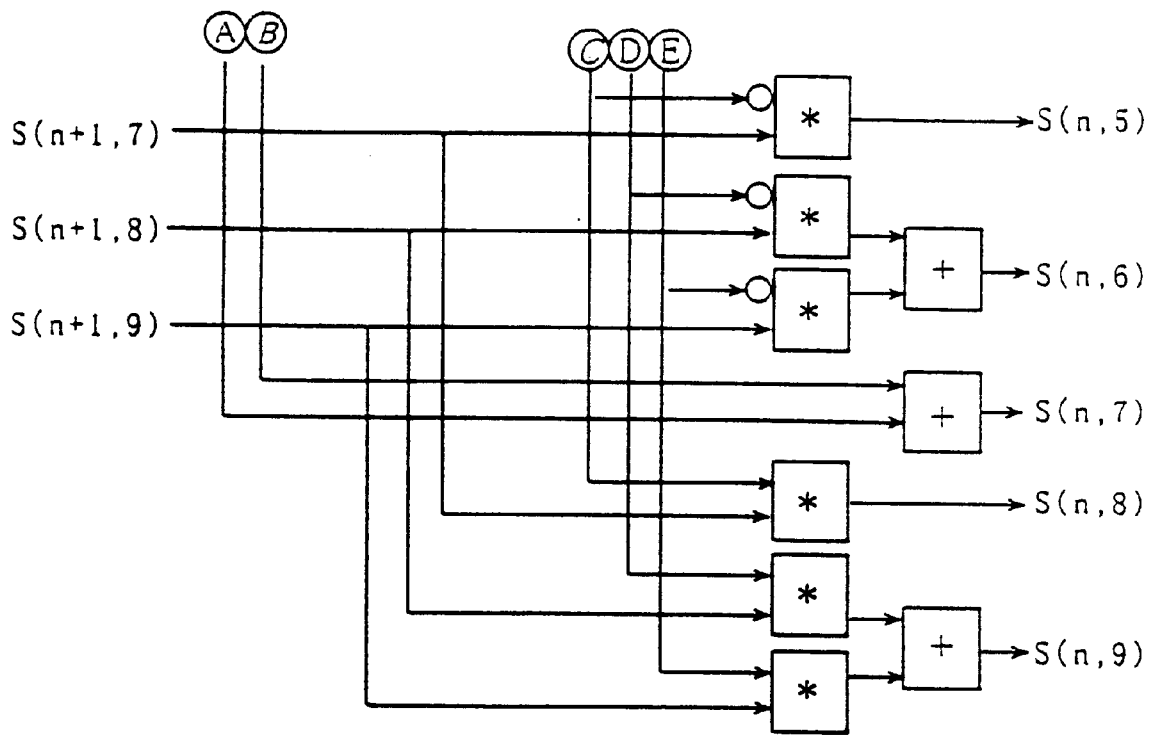

FIGS. 8 and 9 are also block diagrams illustrating the above equations (4).

Next, an example of a composition of the function block FB1 will be explained in FIG. 10. This is a circuit for calculating a previous two-clock data to a four-clock path from the result of a path memory.

Figure 10:
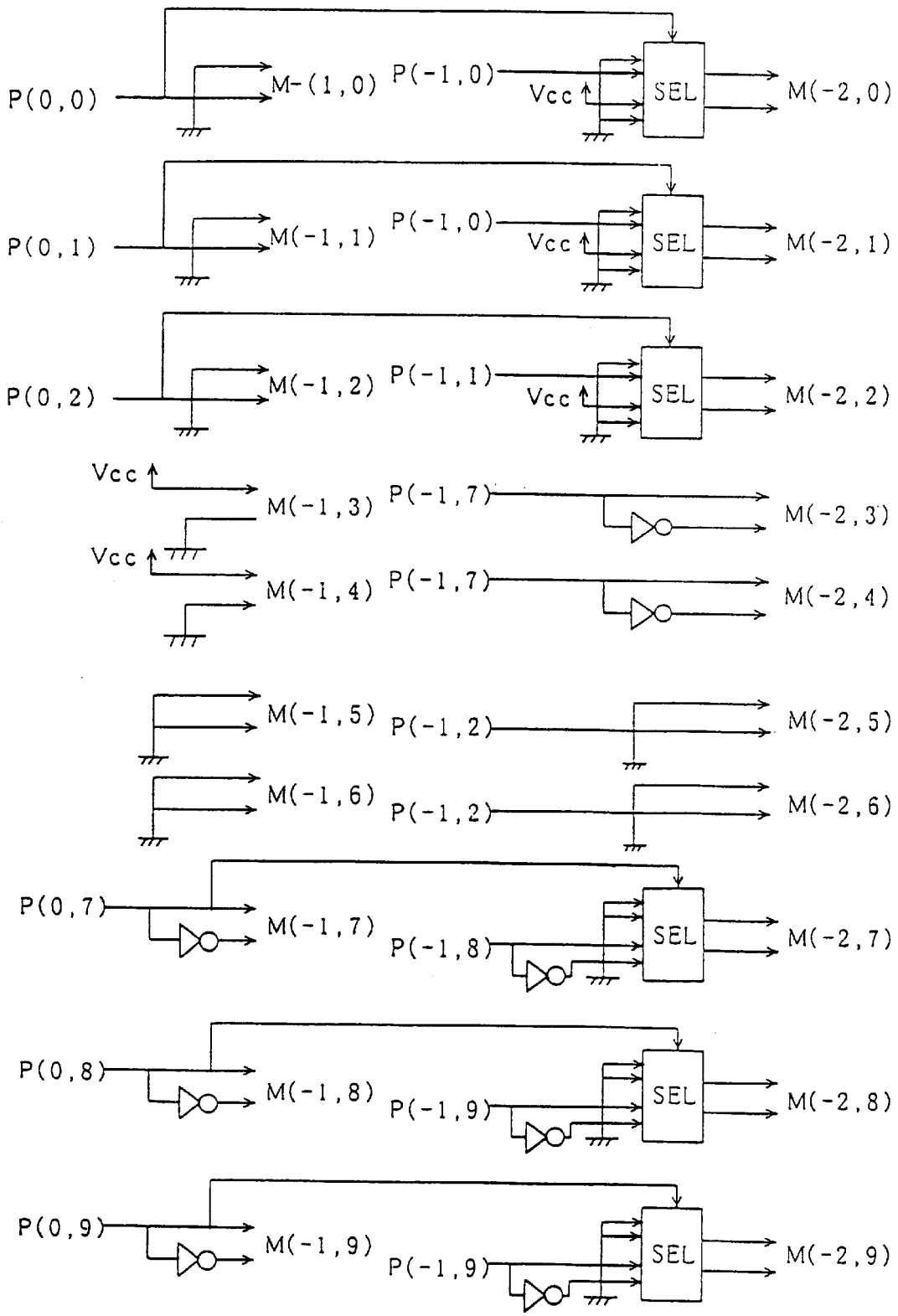
FIG. 10 is a block diagram showing an example of a function block FB1 and previous two-clock data calculating circuit in the first embodiment.

In FIG. 10, shown are circuit blocks where, to respective states 0 to 9 at time n, previous two-clock data at time n−1 and time n−2 are calculated as M(−1,0) to M(−1,9) and M(−2,0) to M(−2,9).

To state 0,
when survival path information P(0,0)=0 is given, M(−1, 0)=0 at time n−1 is obtained since it reaches state 0 at time n−1, further, when P(−1,0)=0 is given, M(−2,0)=0 at time n−2 is obtained since it reaches state 0 at time n−2 and, when P(−1,0)=1 is given, M(−2,0)=1 at time n−2 is obtained since it reaches state 3 at time n−2, when survival path information P(0,0)=1 is given, M(−1, 0)=1 at time n−1 is obtained since it reaches state 3 at time n−1, and M(−2,0)=2 at time n−2 is obtained since it surely reaches state 7 at time n−2.

To state 1, when survival path information P(0,1)=0 is given, M(−1, 1)=0 at time n−1 is obtained since it reaches state 0 at time n−1, further, when P(−1,0)=0 is given, M(−2,1)=0 at time n−2 is obtained since it reaches state 0 at time n−2 and, when P(−1,0)=1 is given, M(−2,1)=1 at time n−2 is obtained since it reaches state 3 at time n−2, when survival path information P(0,1)=1 is given, M(−1, 1)=1 at time n−1 is obtained since it reaches state 3 at time n−1, and M(−2,1)=2 at time n−2 is obtained since it surely reaches state 7 at time n−2.

To state 2,
when survival path information P(0,2)=0 is given, M(−1, 2)=0 at time n−1 is obtained since it reaches state 1 at time n−1, further, when P(−1,1)=0 is given, M(−2,2)=0 at time n−2 is obtained since it reaches state 0 at time n−2 and, when P(−1,1)=1 is given, M(−2,2)=1 at time n−2 is obtained since it reaches state 3 at time n−2, when survival path information P(0,2)=1 is given, M(−1, 2)=1 at time n−1 is obtained since it reaches state 4 at time n−1, and M(−2,2)=2 at time n−2 is obtained since it surely reaches state 7 at time n−2.

To states 3, 4,
M(−1,3)=2, M(−1,4)=2 at time n−1 are obtained since it surely reaches state 7 at time n−1,
further, when P(−1,7)=0 is given, M(−2,3)=1, M(−2,4)=1 at time n−2 are obtained since it reaches state 5 at time n−2, and, when P(−1,7)=1 is given, M(−2,3)=2, M(−2,4)=2 at time n−2 are obtained since it reaches state 8 at time n−2.

To states 5, 6,
M(−1,5)=0, M(−1,6)=0 at time n−1 are obtained since it surely reaches state 2 at time n−1,
further, when P(−1,2)=0 is given, M(−2,5)=0, M(−2,6)=0 at time n−2 are obtained since it reaches state 1 at time n−2, and, when P(−1,2)=1 is given, M(−2,5)=1, M(−2,6)=1 at time n−2 are obtained since it reaches state 4 at time n−2.

To state 7,
when survival path information P(0,7)=0 is given, M(−1, 7)=1 at time n−1 is obtained since it reaches state 5 at time n−1, further, M(−2,7)=0 at time n−2 is obtained since it surely reaches state 2 at time n−2,
when survival path information P(0,7)=1 is given, M(−1, 7)=2 at time n−1 is obtained since it reaches state 8 at time n−1, further, when P(−1,8)=0 is given, M(−2,7)=1 at time n−2 is obtained since it reaches state 6 at time n−2 and, when P(−1,8)=1 is given, M(−2,7)=2 at time n−2 is obtained since it reaches state 9 at time n−2.

To state 8,
when survival path information P(0,8)=0 is given, M(−1, 8)=1 at time n−1 is obtained since it reaches state 6 at time n−1, further, M(−2,8)=0 at time n−2 is obtained since it surely reaches state 2 at time n−2,
when survival path information P(0,8)=1 is given, M(−1, 8)=2 at time n−1 is obtained since it reaches state 9 at time n−1, further, when P(−1,9)=0 is given, M(−2,8)=1 at time n−2 is obtained since it reaches state 6 at time n−2 and, when P(−1,9)=1 is given, M(−2,8)=2 at time n−2 is obtained since it reaches state 9 at time n−2.

To state 9,
when survival path information P(0,9)=0 is given, M(−1, 9)=1 at time n−1 is obtained since it reaches state 6 at time n−1, further, M(−2,9)=0 at time n−2 is obtained since it surely reaches state 2 at time n−2,
when survival path information P(0,9)=1 is given, M(−1, 9)=2 at time n−1 is obtained since it reaches state 9 at time n−1, further, when P(−1,9)=0 is given, M(−2,8)=1 at time n−2 is obtained since it reaches state 6 at time n−2 and, when P(−1,9)=1 is given, M(−2,9)=2 at time n−2 is obtained since it reaches state 9 at time n−2.

FIG. 11 shows a list of addresses of RAM 104.

RAM 104 has data with addresses of six-bit estimation data composed of a four-clock path and a previous two-clock data. In FIG. 11, all addresses which are of ternary data converted by a recording code with a minimum inversion interval of 2 and the corresponding RM(0) to RM(15) are shown.

Initial data are, at first, stored at the respective addresses of RAM 104. These initial data may be values calculated from impulse responses, or values in case of recording and reproducing in an ideal state.

As shown in FIG. 7, the path memory circuit 103 stores tens of clocks of six-bit survival path informations and calculates ten-bit survival state informations. Survival state information at time n is calculated from survival state information at time n+1, i.e., in the future and survival path information.

This calculation is conducted over tens of clocks, therefore survival state information of tens of clocks before is calculated. When one of ten states is on survival state, it means that paths are unified.

When paths are unified to states 0 to 2, a ternary output of "0" and a binary final output of "0" are obtained, when paths are unified to states 3 to 6, a ternary output of "1" and a binary final output of "1" are obtained, and, when paths are unified to states 7 to 9, a ternary output of "2" and a binary final output of "0" are obtained.

However, even when calculating over tens of clocks, paths may not be always unified. If not unified, the number of surviving states of states 0 to 2 and 7 to 9 are compared with the number of surviving states of states 3 to 6. When the former is greater than the latter, a binary final output is to be "0". When the latter is greater than the former, a binary final output is to be "1". When they are equal, it may be "0" or "1".

Finally, the RAM data correcting circuit 105 will be detailed below.

In RAM 104, input data estimation values are stored. Input data characteristics may be varied with time. Therefore, the input data estimation values need changing according to this variation. However, to excessively change them according input data may cause the breaking of RAM data when a burst error occurs.

Therefore, input data and old RAM data with respective weights are added. Namely, using $\mu(0 \leq \mu \leq 1)$, the following equation (5) is obtained:

$$\text{New RAM data} = \mu \times (\text{input data}) + (1-\mu) \times (\text{old RAM data}) \quad (5)$$

Here, address data for the rewriting of RAM data are obtained from path memory output and therefore have tens of stages of delay. Thus, an amount of delay in input data need adjusting.

Another example of the RAM data correcting circuit 105 will be explained below. In this example, difference values by subtracting an old RAM data from an input data are accumulated and, when the accumulated value exceeds a threshold value, RAM data are increased by one step, or, when it is less than the threshold value, RAM data are decreased by one step, thereby minimizing the difference value. Here, address data for the rewriting of RAM data are obtained from path memory output and therefore have tens of stages of delay. Thus, an amount of delay in input data need adjusting. The threshold value may be an arbitrary real number. Also, one step may be a digital level of "1", or another arbitrary real number.

Correction may be conducted only at data area other than track address, track jump, preamble, gap for edition etc. to reduce a wrong correcting operation caused by an unstable operation as much as possible. Also, it may be conducted only in case of a regular reproduction. Further, it may be conducted after recording and reproduction is stabilized. Still further, it may be conducted only when the error rate is less than a value. Still yet further, these methods may be combined.

Also, to reduce a wrong correcting operation when a code error occurs, correction may be conducted by designating, at first, a range where input data may vary from initial data preset in RAM, and controlling to put within the range by a limiter or controlling to return to the preset value when it varies exceeding the range. Also, a variation range per one round may be limited and, when exceeding the variation range, it may be stopped at a maximum variation or a variation of that round may be prohibited. Furthermore, when a difference absolute value between input data and old RAM data is greater than a value, correcting operation or accumulation may be prohibited.

Next, preferred embodiments of the invention other than the above-mentioned embodiment(corresponding to claim 9 defined later) will be briefly explained.

Figure 12:
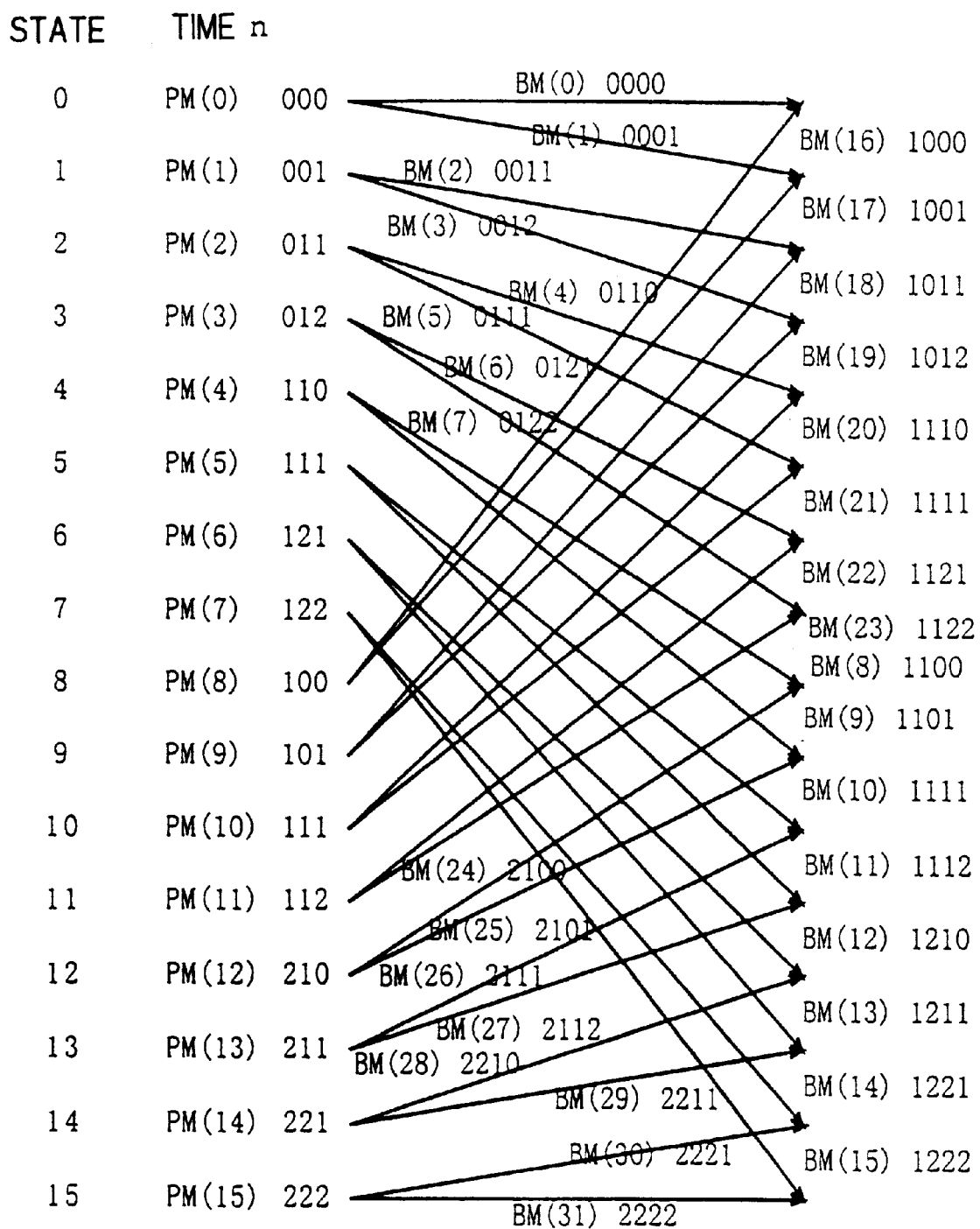
FIG. 12 is a diagram showing a state change in a second preferred embodiment according to the invention(relating to claims 17, 18 defined later)

FIG. 12 shows a state change as to the second preferred embodiment of the invention.

In the second embodiment, the condition of minimum inversion interval in the first embodiment is removed. PR(1, 1) pre-equalization and a reproduction data of ternary levels (0,1,2) are used. Paths or branchmetrics are of four-clock data:

0000, 0001, 0011, 0012, 0110, 0111, 0121, 0122, 1100, 1101, 1111, 1112, 1210, 1211, 1221, 1222, 1000, 1001, 1011, 1012, 1110, 1111, 1121, 1122, 2100, 2101, 2111, 2112, 2210, 2211, 2221, 2222.

States or pathmetrics are of three-clock data:

000, 001, 011, 012, 110, 111, 121, 122, 100, 101, 111, 112, 210, 211, 221, 222.

The path selection and unifying of pathmetrics are given by expanding the procedures in FIGS. 2 and 3 according to conditions in FIG. 12. The whole composition of a data-reproducing device in the second embodiment is similar to that shown in FIG. 4.

Subtraction absolute value/comparison and selection circuits are given by expanding the compositions in FIGS. 5 and 6 according to the conditions in FIG. 12. A path memory circuit is given by expanding the composition in FIG. 7 to have P(0,0) to P(0,15) and S(0,0) to S(0,15) according to the conditions in FIG. 12.

FB0s for getting survival state informations S(0,0) to S(0,15) are given by expanding the compositions in FIGS. 8 and 9 according to the conditions in FIG. 12, and FB1s for getting previous two-clock data are given by expanding the composition in FIG. 10 according to the conditions in FIG. 12. RAM addresses are given by expanding those in FIG. 11 according to the conditions in FIG. 12. RAM data correcting circuit is similar to that in the first embodiment.

Figure 13:
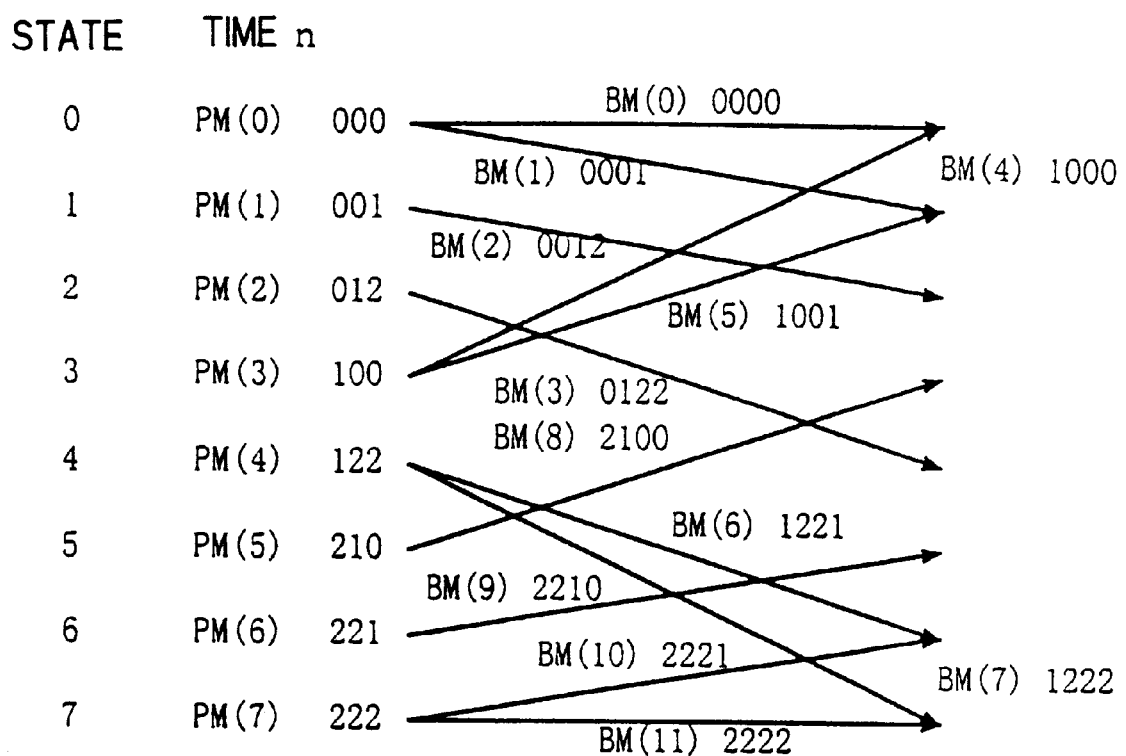
FIG. 13 is a diagram showing a state change ina third preferred embodiment according to the invention(relating to claims 23 to 26 defined later)

FIG. 13 shows a state change as to the third preferred embodiment of the invention.

In the third embodiment, the condition of a minimum inversion interval of 3 is given in contrast to the first embodiment. PR(1,1) pre-equalization and a reproduction data of ternary levels (0,1,2) are used. In this coding, there are characteristics that two or more bits of "1" do not continue, "1" always exists between "0" and "2" or "2" and "0" and a sequence of "0" then "1" is always followed by "2", and a sequence of "2" then "1" is always followed by "0", and further that sequences of "101" and "121" do not exist, i.e., "0" and "2" always continue by two bits or more.

Paths or branchmetrics are of four-clock data:

0000, 0001, 0012, 0122, 1000, 1001, 1221, 1222, 2100, 2210, 2221, 2222.

States or pathmetrics are of three-clock data:

000, 001, 012, 100, 122, 210, 221, 222.

The path selection and unifying of pathmetrics are given by reducing the procedures in FIGS. 2 and 3 according to conditions in FIG. 13. The whole composition of a data-reproducing device in the third embodiment is similar to that shown in FIG. 4.

Subtraction absolute value/comparison and selection circuits are given by reducing the compositions in FIGS. 5 and 6 according to the conditions in FIG. 13. A path memory circuit is given by reducing the composition in FIG. 7 to have P(0,0), P(0,1), P(0,6), P(0,7) and S(0,0) to S(0,7) according to the conditions in FIG. 13.

FB0s forgetting survival state informations S(0,0) to S(0,7) are given by reducing the compositions in FIGS. 8 and 9 according to the conditions in FIG. 13, and FB1s for getting previous two-clock data are given by reducing the composition in FIG. 10 according to the conditions in FIG. 13. RAM addresses are given by reducing those in FIG. 11 according to the conditions in FIG. 13. RAM data correcting circuit is similar to that in the first embodiment.

Figure 14:
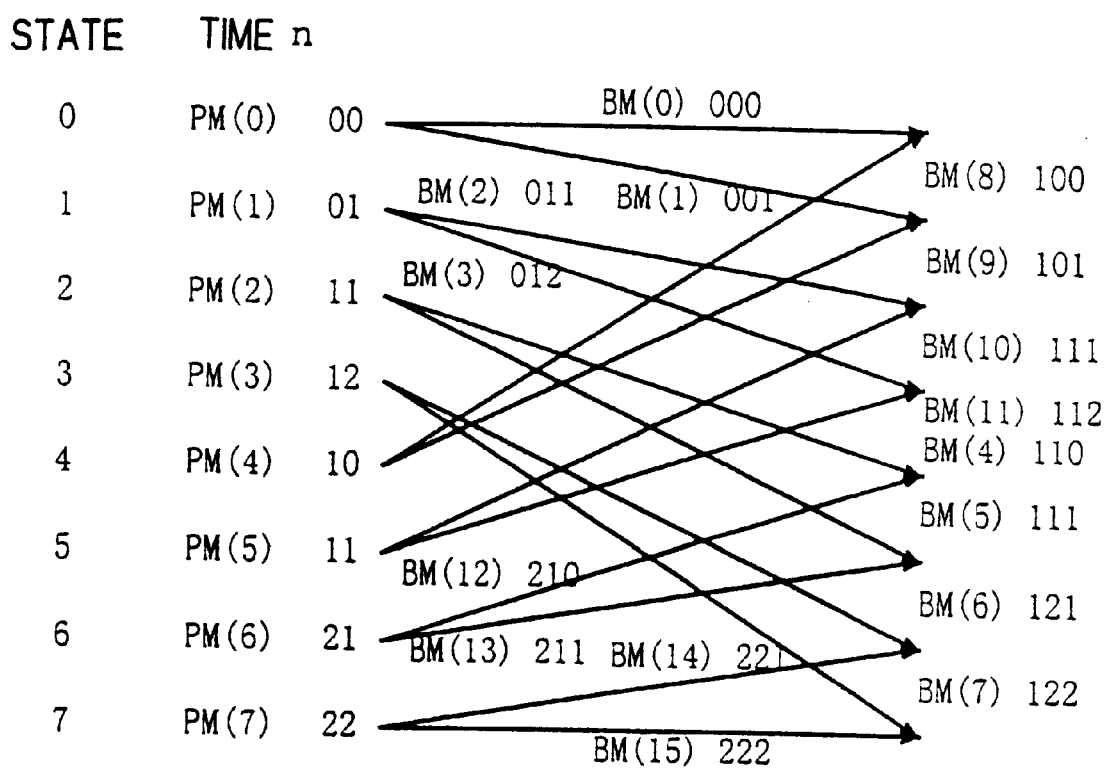
FIG. 14 is a diagram showing a state change in a fourth preferred embodiment according to the invention (relating to claims 7, 8 defined later)

FIG. 14 shows a state change as to the fourth preferred embodiment of the invention.

In the fourth embodiment, the condition of minimum inversion interval in the first embodiment is removed and paths and branchmetrics are reduced to three-clock data. PR(1,1) pre-equalization and a reproduction data of ternary levels(0,1,2) are used. Paths or branchmetrics are of three-clock data:

000, 001, 011, 012, 110, 111, 121, 122, 100, 101, 111, 112, 210, 211, 221, 222.

States or pathmetrics are of two-clock data:

00, 01, 11, 12, 10, 11, 21, 22.

The path selection and unifying of pathmetrics are given by expanding the procedures in FIGS. 2 and 3 according to conditions in FIG. 14. The whole composition of a data-reproducing device in the fourth embodiment is similar to that shown in FIG. 4.

Subtraction absolute value/comparison and selection circuits are given by expanding the compositions in FIGS. 5 and 6 according to the conditions in FIG. 14. A path memory circuit is given by expanding the composition in FIG. 7 to have P(0,0) to P(0,7) and S(0,0) to S(0,7) according to the conditions in FIG. 14.

FB0s for getting survival state informations S(0,0) to S(0,7) are given by expanding the compositions in FIGS. 8 and 9 according to the conditions in FIG. 14, and FB1s for getting previous two-clock data are given by expanding the composition in FIG. 10 according to the conditions in FIG.

14. RAM addresses are given by expanding those in FIG. 11 according to the conditions in FIG. 14. RAM data correcting circuit is similar to that in the first embodiment.

Figure 15:
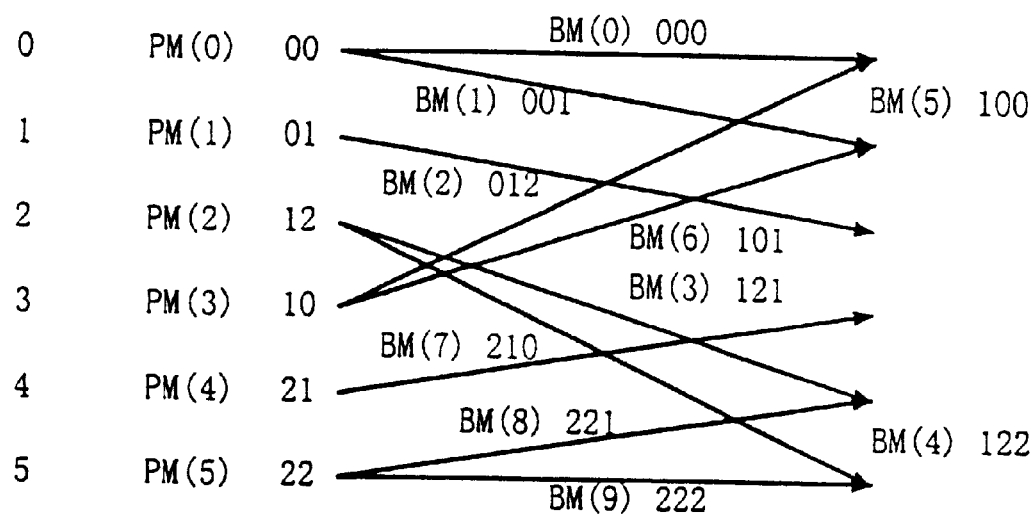
FIG. 15 is a diagram showing a state change in a fifth preferred embodiment according to the invention (relating to claims 9 to 12 defined later)

FIG. 15 shows a state change as to the fifth preferred embodiment of the invention.

In the fifth embodiment, in contrast to the first embodiment, the condition of a minimum inversion interval of 2 is given and paths and branchmetrics are reduced to three-clock data. PR(1,1) pre-equalization and a reproduction data of ternary levels(0,1,2) are used. Paths or branchmetrics are of three-clock data:

000, 001, 012, 121, 122,
100, 101, 210, 221, 222.

States or pathmetrics are of two-clock data:

00, 01, 12, 10, 21, 22.

The path selection and unifying of pathmetrics are given by reducing the procedures in FIGS. 2 and 3 according to conditions in FIG. 15. The whole composition of a data-reproducing device in the fifth embodiment is similar to that shown in FIG. 4.

Subtraction absolute value/comparison and selection circuits are given by expanding the compositions in FIGS. 5 and 6 according to the conditions in FIG. 15. A path memory circuit is given by reducing the composition in FIG. 7 to have P(0,0), P(0,4), P(0,5) and S(0,0) to S(0,5) according to the conditions in FIG. 15.

FB0s for getting survival state informations S(0,0) to S(0,5) are given by reducing the compositions in FIGS. 8 and 9 according to the conditions in FIG. 15, and FB1s for getting previous two-clock data are given by reducing the composition in FIG. 10 according to the conditions in FIG. 15. RAM addresses are given by reducing those in FIG. 11 according to the conditions in FIG. 15. RAM data correcting circuit is similar to that in the first embodiment.

Figure 16:
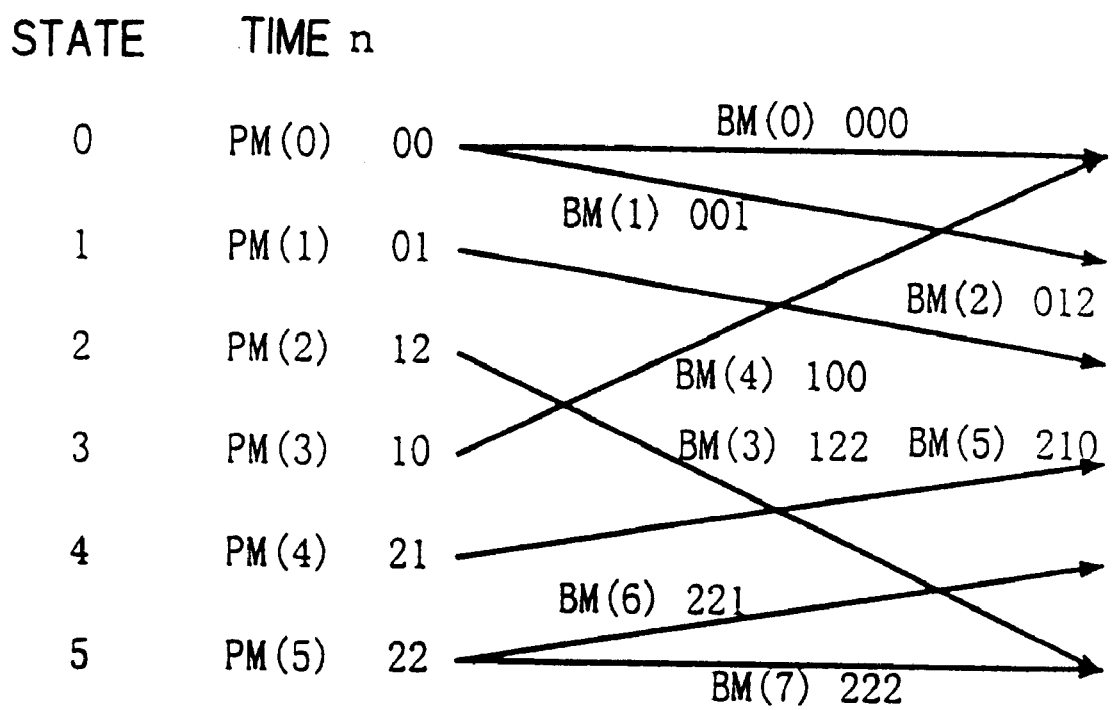
FIG. 16 is a diagram showing a state change in a sixth preferred embodiment according to the invention (relating to claims 13 to 16 defined later)

FIG. 16 shows a state change as to the sixth preferred embodiment of the invention.

In the sixth embodiment, in contrast to the first embodiment, the condition of a minimum inversion interval of 3 is given and paths and branchmetrics are reduced to three-clock data. PR(1,1) pre-equalization and a reproduction data of ternary levels (0,1,2) are used. Paths or branchmetrics are of three-clock data:

000, 001, 012, 122,
100, 210, 221, 222.

States or pathmetrics are of two-clock data:

00, 01, 12, 10, 21, 22.

The path selection and unifying of pathmetrics are given by reducing the procedures in FIGS. 2 and 3 according to conditions in FIG. 16. The whole composition of a data-reproducing device in the sixth embodiment is similar to that shown in FIG. 4.

Subtraction absolute value/comparison and selection circuits are given by reducing the compositions in FIGS. 5 and 6 according to the conditions in FIG. 16. A path memory circuit is given by reducing the composition in FIG. 7 to have P(0,0) , P(0,5) and S(0,0) to S(0,5) according to the conditions in FIG. 16.

FB0s for getting survival state informations S(0,0) to S(0,5) are given by reducing the compositions in FIGS. 8 and 9 according to the conditions in FIG. 16, and FB1s for getting previous two-clock data are given by reducing the composition in FIG. 10 according to the conditions in FIG. 16. RAM addresses are given by reducing those in FIG. 11 according to the conditions in FIG. 16. RAM data correcting circuit is similar to that in the first embodiment.

Figure 17:
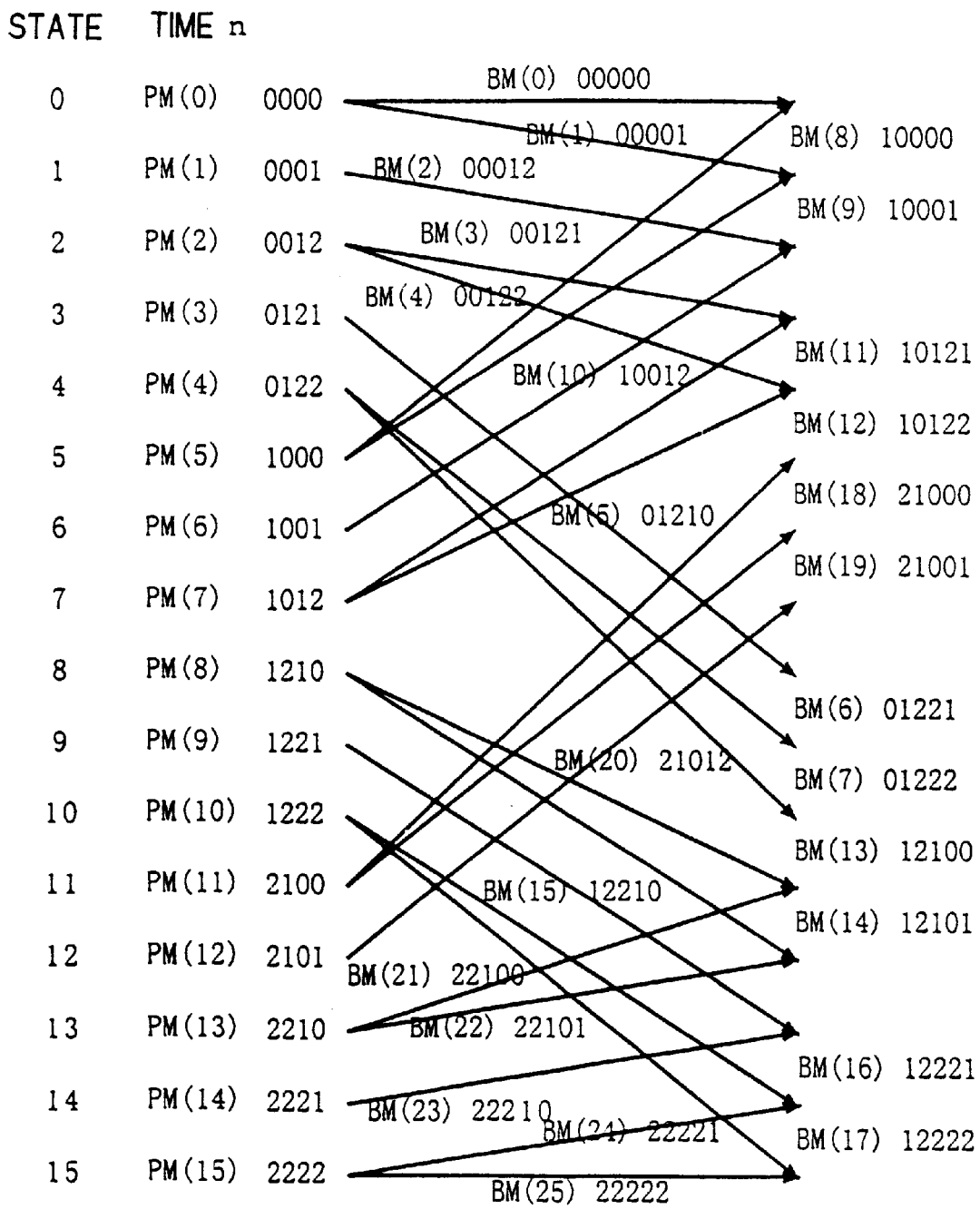
FIG. 17 is a diagram showing a state change in a seventh preferred embodiment according to the invention (relating to claims 27 to 30 defined later)

FIG. 17 shows a state change as to the seventh preferred embodiment of the invention.

In the seventh embodiment, in contrast to the first embodiment, the condition of a minimum inversion interval of 2 is given and paths and branchmetrics are expanded to five-clock data. PR(1,1) pre-equalization and a reproduction data of ternary levels(0,1,2) are used. Paths or branchmetrics are of five-clock data:

00000, 00001, 00012,
00121, 00122, 01210,
01221, 01222, 10000,
10001, 10012, 10121,
10122, 12100, 12101,
12210, 12221, 12222,
21000, 21001, 21012,
22100, 22101, 22210,
22221, 22222.

States or pathmetrics are of four-clock data:

0000, 0001, 0012, 0121,
0122, 1000, 1001, 1012,
1210, 1221, 1222, 2100,
2101, 2210, 2221, 2222.

The path selection and unifying of pathmetrics are given by expanding the procedures in FIGS. 2 and 3 according to conditions in FIG. 17. The whole composition of a data-reproducing device in the seventh embodiment is similar to that shown in FIG. 4.

Subtraction absolute value/comparison and selection circuits are given by expanding the compositions in FIGS. 5 and 6 according to the conditions in FIG. 17. A path memory circuit is given by expanding the composition in FIG. 7 to have P(0,0) to P(0,4) , P(0,11) to P(0,15)and S(0,0) to S(0,15) according to the conditions in FIG. 17.

FB0s for getting survival state informations S(0,0) to S(0,15) are given by expanding the compositions in FIGS. 8 and 9 according to the conditions in FIG. 17, and FB1s for getting previous two-clock data are given by expanding the composition in FIG. 10 according to the conditions in FIG. 17. RAM addresses are given by expanding those in FIG. 11 according to the conditions in FIG. 17. RAM data correcting circuit is similar to that in the first embodiment.

Figure 18:
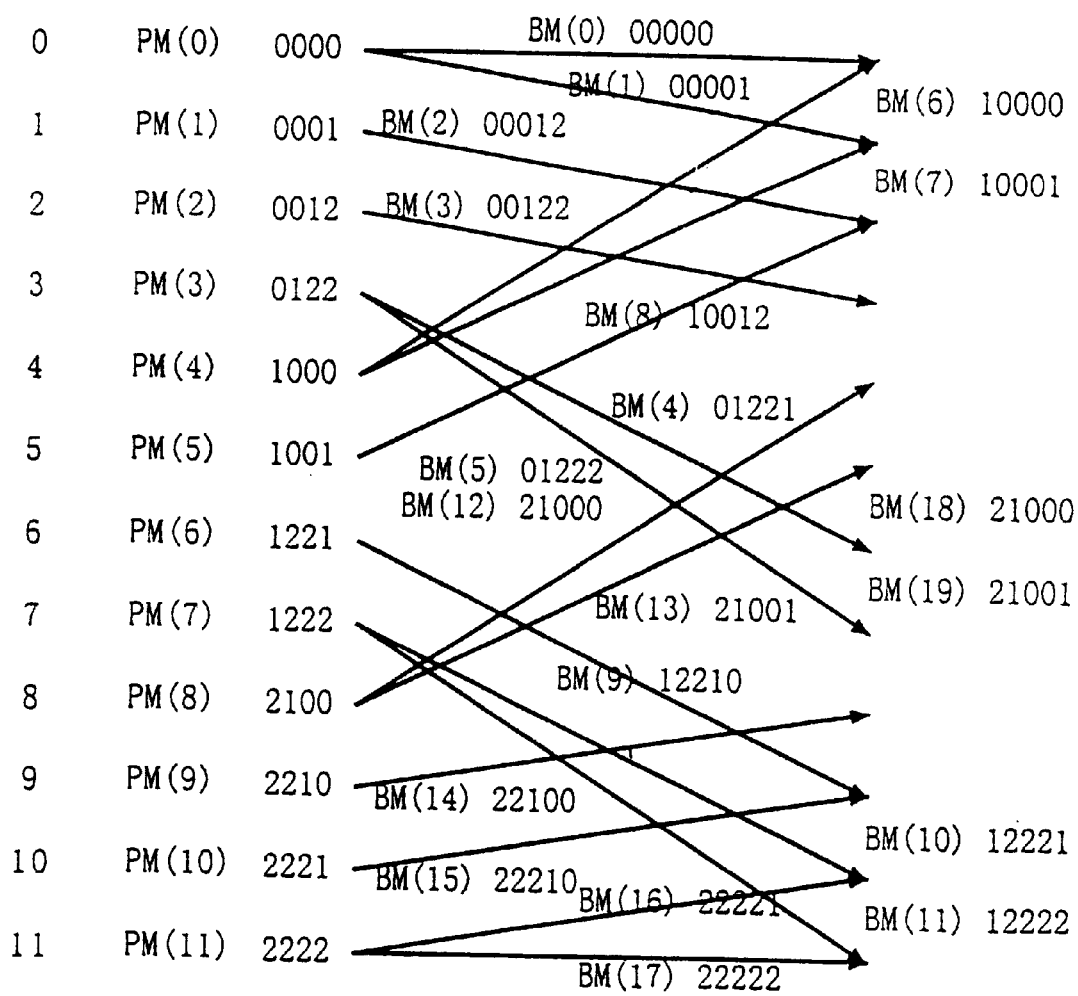
FIG. 18 is a diagram showing a state change in an eighth preferred embodiment according to the invention (relating to claims 31 to 34 defined later)

FIG. 18 shows a state change as to the eighth preferred embodiment of the invention.

In the eighth embodiment, in contrast to the first embodiment, the condition of a minimum inversion interval of 3 is given and paths and branchmetrics are expanded to five-clock data. PR(1,1) pre-equalization and a reproduction data of ternary levels (0,1,2) are used. Paths or branchmetrics are of five-clock data:

00000, 00001, 00012,
00122, 01221, 01222,
10000, 10001, 10012,
12210, 12221, 12222,
21000, 21001, 22100,
22210, 22221, 22222.

States or pathmetrics are of four-clock data:

0000, 0001, 0012, 0122,
1000, 1001, 1221, 1222,
2100, 2210, 2221, 2222.

The path selection and unifying of pathmetrics are given by expanding the procedures in FIGS. 2 and 3 according to conditions in FIG. 18. The whole composition of a data-reproducing device in the eighth embodiment is similar to that shown in FIG. 4.

Subtraction absolute value/comparison and selection circuits are given by expanding the compositions in FIGS. 5 and 6 according to the conditions in FIG. 18. A path memory circuit is given by expanding the composition in FIG. 7 to have P(0,0) to P(0,2), P(0,9) to P(0,11)and S(0,0) to S(0,11) according to the conditions in FIG. 18.

FB0s for getting survival state informations S(0,0) to S(0,11) are given by expanding the compositions in FIGS. 8 and 9 according to the conditions in FIG. 18, and FB1s for getting previous two-clock data are given by expanding the composition in FIG. 10 according to the conditions in FIG. 18. RAM addresses are given by expanding those in FIG. 11 according to the conditions in FIG. 18. RAM data correcting circuit is similar to that in the first embodiment.

Figure 19:
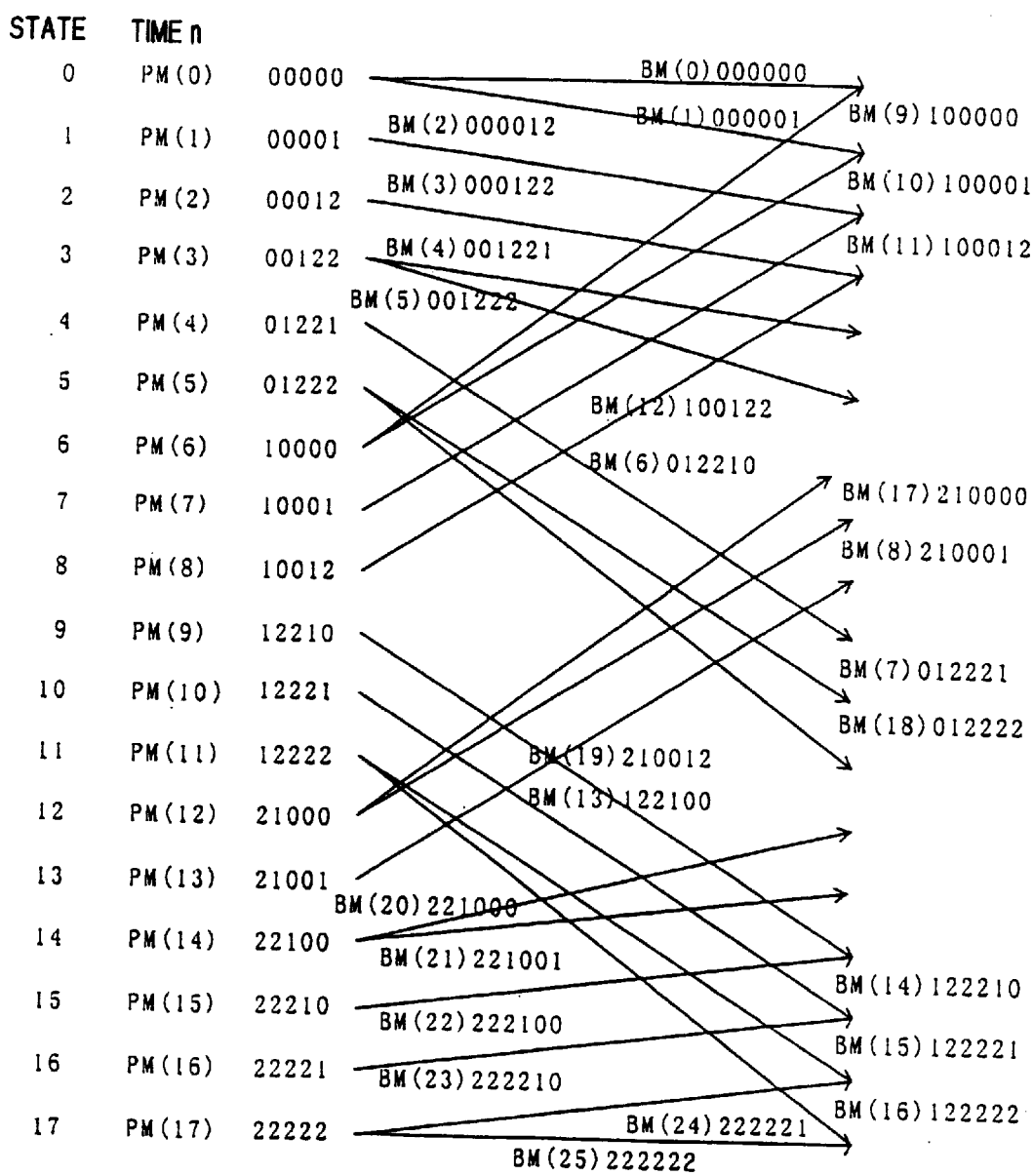
FIG. 19 is a diagram showing a state change in a ninth preferred embodiment according to the invention(relating to claims 35 to 38 defined later)

FIG. 19 shows a state change as to the ninth preferred embodiment of the invention.

In the ninth embodiment, in contrast to the first embodiment, the condition of a minimum inversion interval of 3 is given and paths and branchmetrics are expanded to six-clock data. PR(1,1) pre-equalization and a reproduction data of ternary levels(0,1,2) are used. Paths or branchmetrics are of six-clock data:

000000, 000001, 000012,
000122, 001221, 001222,
012210, 012221, 012222,
100000, 100001, 100012,
100122, 122100, 122210,
122221, 122222, 210000,
210001, 210012, 221000,
221001, 222100, 222210,
222221, 222222.

States or pathmetrics are of five-clock data:

00000, 00001, 00012,
00122, 01221, 01222,
10000, 10001, 10012,
12210, 12221, 12222,
21000, 21001, 22100,
22210, 22221, 22222.

The path selection and unifying of pathmetrics are given by expanding the procedures in FIGS. 2 and 3 according to conditions in FIG. 19. The whole composition of a data-reproducing device in the ninth embodiment is similar to that shown in FIG. 4.

Subtraction absolute value/comparison and selection circuits are given by expanding the compositions in FIGS. 5 and 6 according to the conditions in FIG. 19. A path memory circuit is given by expanding the composition in FIG. 7 to have P(0,0) to P(0,3), P(0,14) to P(0,17) and S(0,0) to S(0,17) according to the conditions in FIG. 19.

FB0s for getting survival state informations S(0,0) to S(0,17) are given by expanding the compositions in FIGS. 8 and 9 according to the conditions in FIG. 19, and FB1s for getting previous two-clock data are given by expanding the composition in FIG. 10 according to the conditions in FIG. 19. RAM addresses are given by expanding those in FIG. 11 according to the conditions in FIG. 19. RAM data correcting circuit is similar to that in the first embodiment.

Also, even when paths and branchmetrics are of 2 or less clock data, paths and branchmetrics are of 5 or more clock data without conditions of minimum inversion interval, paths and branchmetrics are of 6 or more clock data with the conditions of a minimum inversion interval of 2, or paths and branchmetrics are of 7 or more clock data with the conditions of a minimum inversion interval of 3, like state changes can be obtained by like ideas as described above, and output data can be calculated by expanding or reducing FIGS. 2 to 11.

Meanwhile, the above embodiments are showing examples where all circuits are operated using an input data clock. However, when a digital image signal etc. is recorded and reproduced, the circuit becomes difficult to operate even when using LSI since the clock frequency may be highly increased to, e.g., about 150 MHz.

To solve this problem, input data may be serial-to-parallel converted by a unit of n clocks(1<n), and operations after that may be conducted by using one operation where n clocks are united.

Such an operation, where a minimum inversion interval of 2 is given, paths and branchmetrics are of three-clock data and an operation in which three clocks are united is used, will be explained as the tenth preferred embodiment of the invention. In the tenth embodiment, the state change in FIG. 15 is used.

Figure 20:
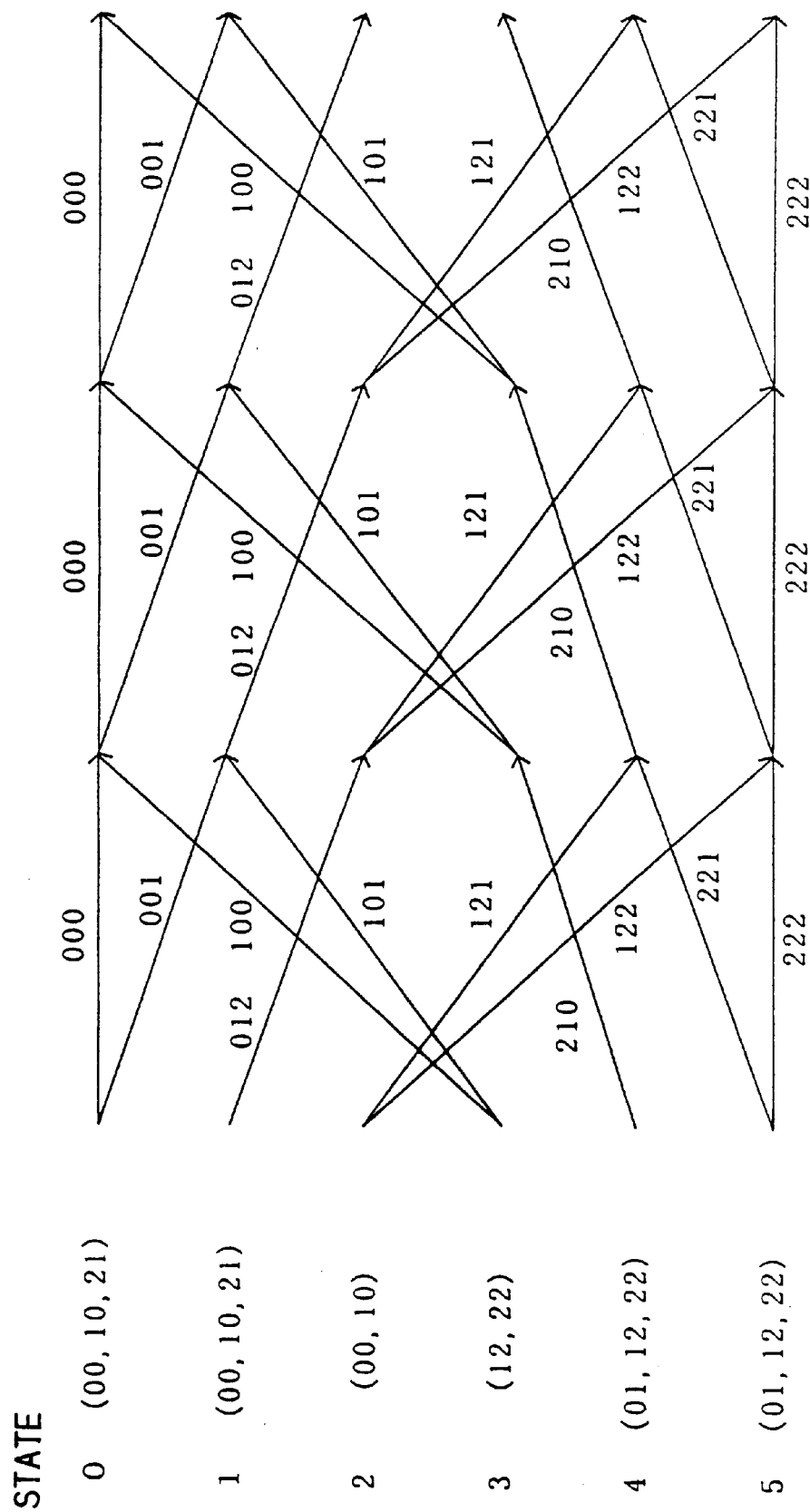
FIG. 20 is a diagram showing a state change where paths are selected extending by two clocks from those in FIG. 15, FIGS. 21 and 22 are diagrams showing a state change in a tenth preferred embodiment according to the invention, where a unit of three clocks is used.

FIG. 20 shows the state change in FIG. 15 extended to three clocks. When a previous two-bit data is also used herein, to states 0, 1, any one of 00, 10 and 21 is selected, to state 2, either 00 or 10 is selected, to state 3, either 12 or 22 is selected and, to states 4, 5, any one of 01, 12 and 22 is selected.

Figure 21:
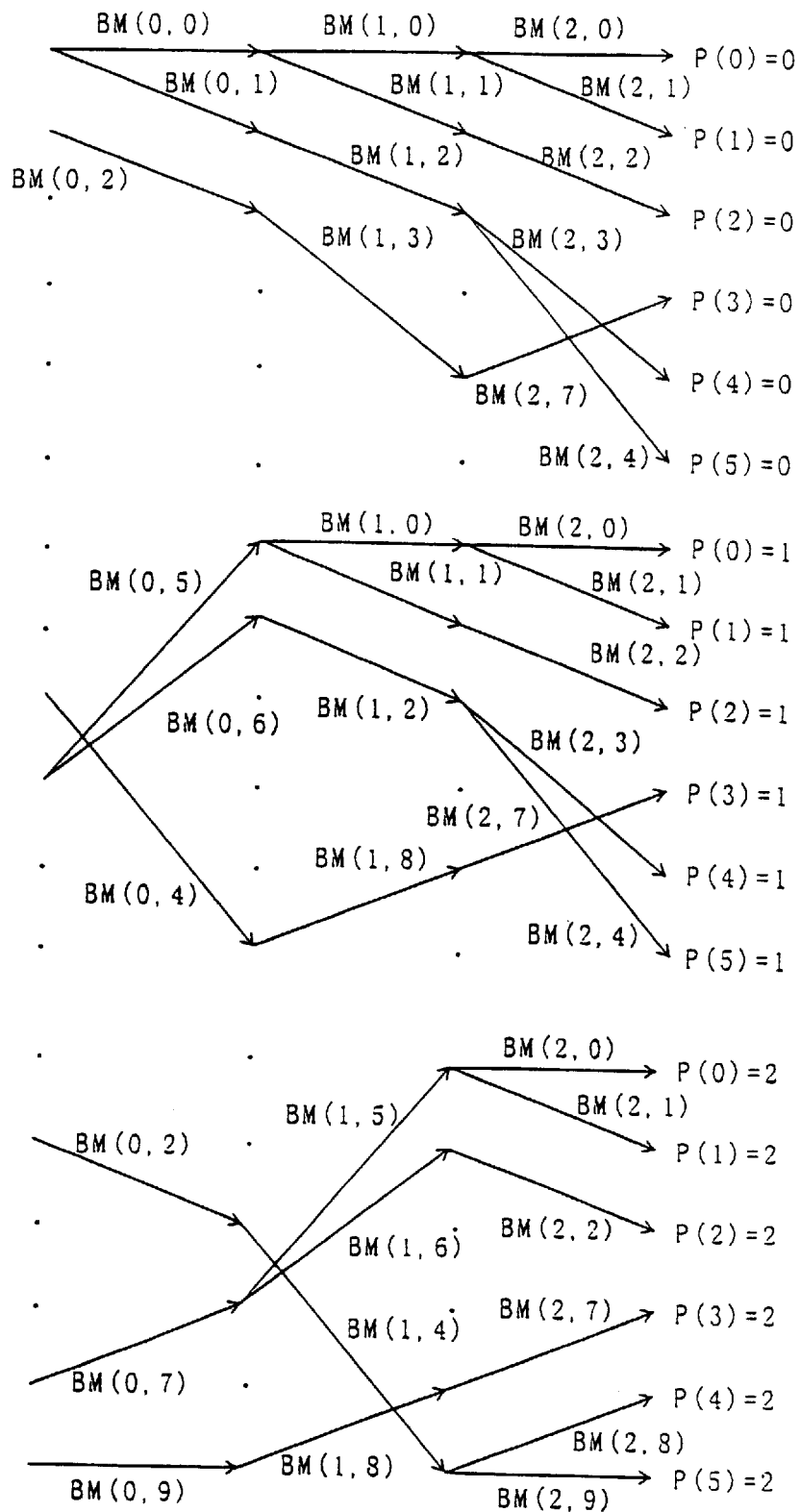
Figure 22:
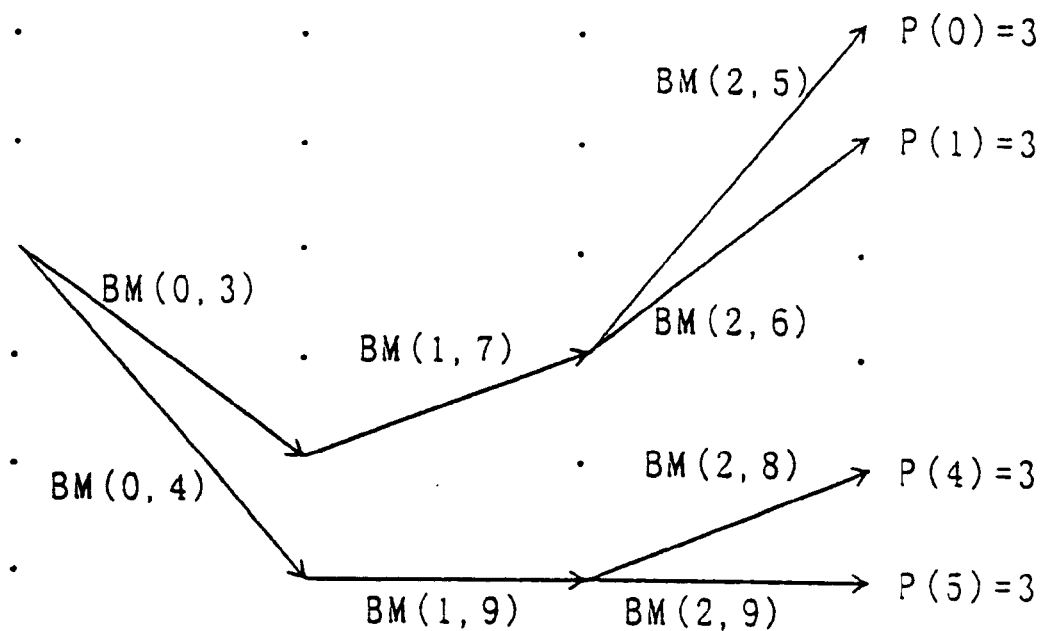
Figure 22:
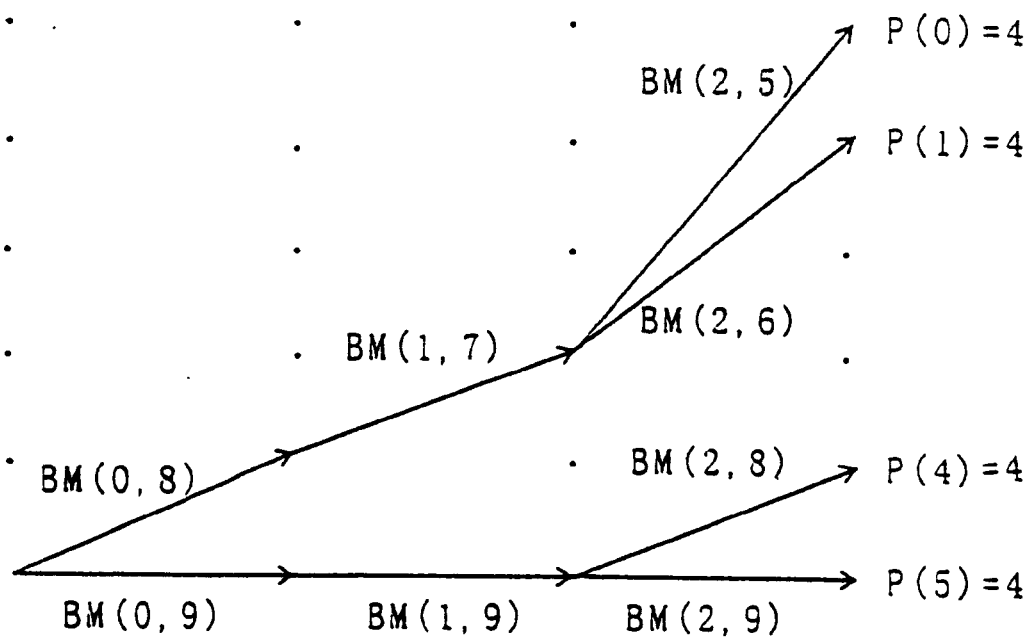

Next, FIGS. 21 and 22 show pathmetrics and branchmetrics to reach respective states while having a unit of three clocks. FIGS. 21 and 22 are divided for the convenience of drawing.

Three arrows linking in the direction of a lateral axis are corresponding to individually one clock (CK), totally three clocks. As shown, a pathmetric at each state is obtained by selecting smallest one of addition values of pathmetrics at three clocks before and three branchmetrics from the pathmetrics at three clocks before to the pathmetric concerned. Namely, it is obtained according to equation 6:

$$PM(0)=\min[PM(0)+BM(0,0)+BM(1,0)+BM(2,0), PM(3)+BM(0,5)+BM(1,0)+BM(2,0), PM(4)+BM(0,7)+BM(1,5)+BM(2,0),$$

$$PM(2)+BM(0,3)+BM(1,7)+BM(2,5), PM(5)+BM(0,8)+BM(1,7)+BM(2,5)]$$

$$PM(1)=\min[PM(0)+BM(0,0)+BM(1,0)+BM(2,1), PM(3)+BM(0,5)+BM(1,0)+BM(2,1), PM(4)+BM(0,7)+BM(1,5)+BM(2,1),$$

$$PM(2)+BM(0,3)+BM(1,7)+BM(2,6), PM(5)+BM(0,8)+BM(1,7)+BM(2,6)]$$

$$PM(2)=\min[PM(0)+BM(0,0)+BM(1,1)+BM(2,2), PM(3)+BM(0,5)+BM(1,1)+BM(2,2), PM(4)+BM(0,7)+BM(1,6)+BM(2,2)]$$

$$PM(3)=\min[PM(1)+BM(0,2)+BM(1,3)+BM(2,7), PM(2)+BM(0,4)+BM(1,8)+BM(2,7), PM(5)+BM(0,9)+BM(1,8)+BM(2,7)]$$

$$PM(4)=\min[PM(0)+BM(0,1)+BM(1,2)+BM(2,3),$$

$$PM(3)+BM(0,6)+BM(1,2)+BM(2,3), PM(1)+BM(0,2)+BM(1,4)+BM(2,8), PM(2)+BM(0,4)+BM(1,9)+BM(2,8), PM(5)+BM(0,9)+BM(1,9)+BM(2,8)]$$

$$PM(5)=\min[PM(0)+BM(0,1)+BM(1,2)+BM(2,4),$$

$$PM(3)+BM(0,6)+BM(1,2)+BM(2,4), PM(1)+BM(0,2)+BM(1,4)+BM(2,9), PM(2)+BM(0,4)+BM(1,9)+BM(2,9), PM(5)+BM(0,9)+BM(1,9)+BM(2,9)] \qquad (6)$$

where a right-hand pathmetric has a value one clock older than a left-hand pathmetric.

Also, survival paths P(0) to P(5) are determined by which term in min [] is selected in equation (6).

Namely, P(0) is 0 when the first term in min [] of PM(0) in equation (6) is selected, 1 when the second term is selected, 2 when the third term is selected, 3 when the fourth term is selected and 4 when the fifth term is selected, P(1) is 0 when the first term in min [] of PM(1) in equation (6) is selected, 1 when the second term is selected, 2 when the third term is selected, 3 when the fourth term is selected and 4 when the fifth term is selected, P(2) is 0 when the first term in min [] of PM(2) in equation (6) is selected, 1 when the second term is selected and 2 when the third term is selected, P(3) is 0 when the first term in min [] of PM(3) in equation (6) is selected, 1 when the second term is selected and 2 when the third term is selected, P(4) is 0 when the first term in min [] of PM(4) in equation (6) is selected, 1 when the second term is selected, 2 when the third term is selected, 3 when the fourth term is selected and 4 when the fifth term is selected, and P(5) is 0 when the first term in min [] of PM(5) in equation (6) is selected, 1 when the second term is selected, 2 when the third term is selected, 3 when the fourth term is selected and 4 when the fifth term is selected.

Thus, a pathmetric to three clocks (CK) is calculated to select a path, a survival path is continued in an arrow form and a five-bit estimation data at each path to one clock (CK) is obtained. These selection are conducted like those in FIG. 2.

Figure 4:
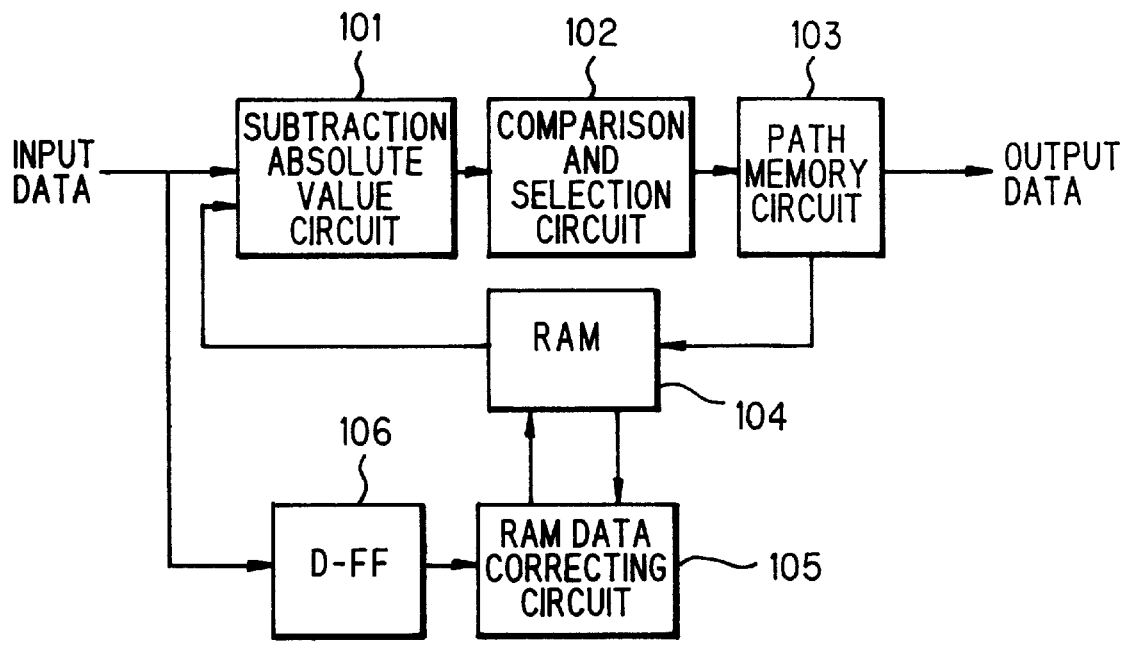
FIG. 4 is a block diagram showing a whole composition of a data-reproducing device in a first preferred embodiment according to the invention.

The whole composition of a data-reproducing device in the tenth embodiment is similar to that in FIG. 4. However, to the head, a three-phase developing circuit and a serial-to parallel S/P) converter circuit are inserted.

Figure 23:
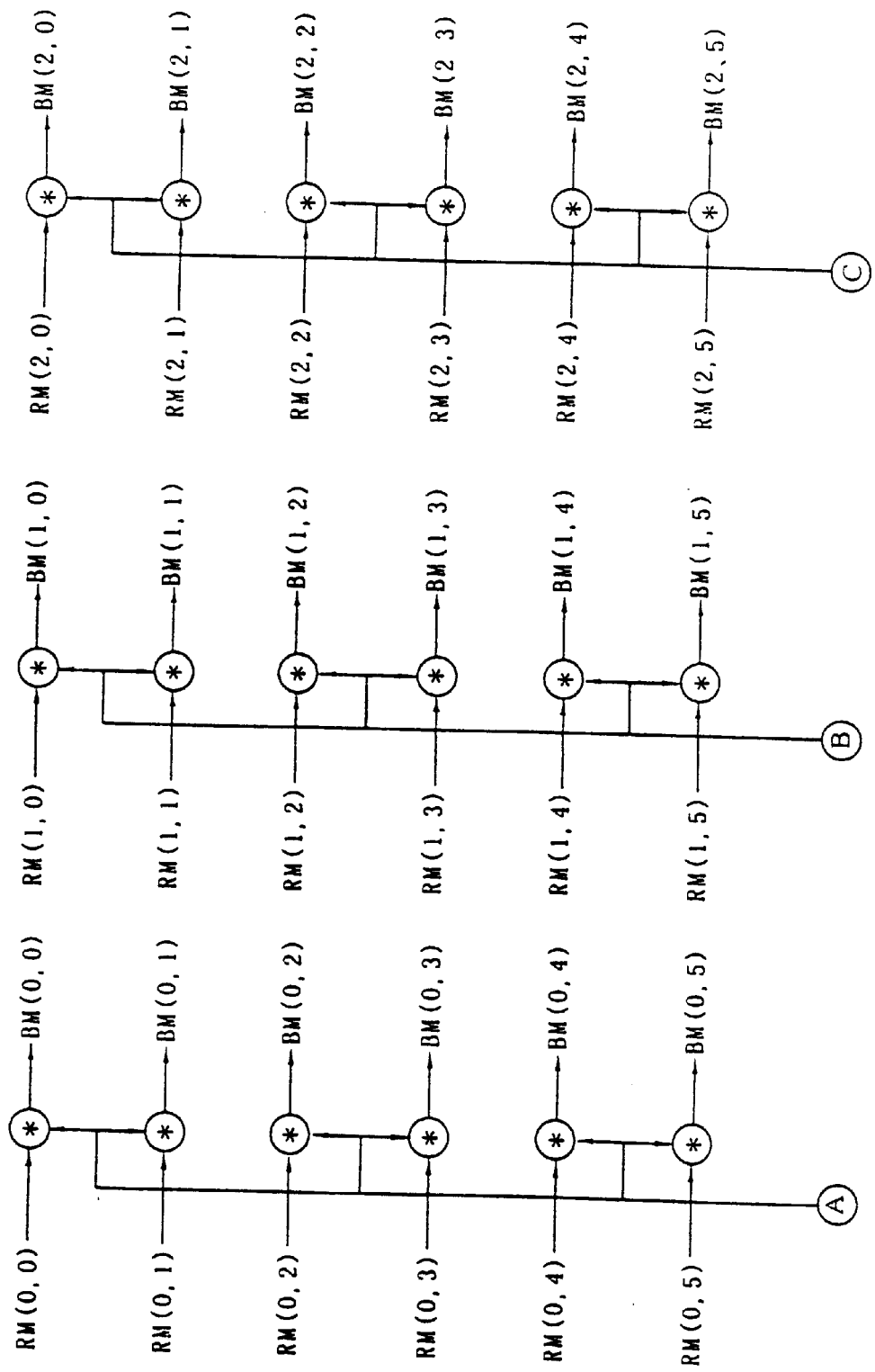
FIGS. 23 and 24 are diagrams showing a subtraction absolute value circuit for three-clock operation in the tenth embodiment.
Figure 24:
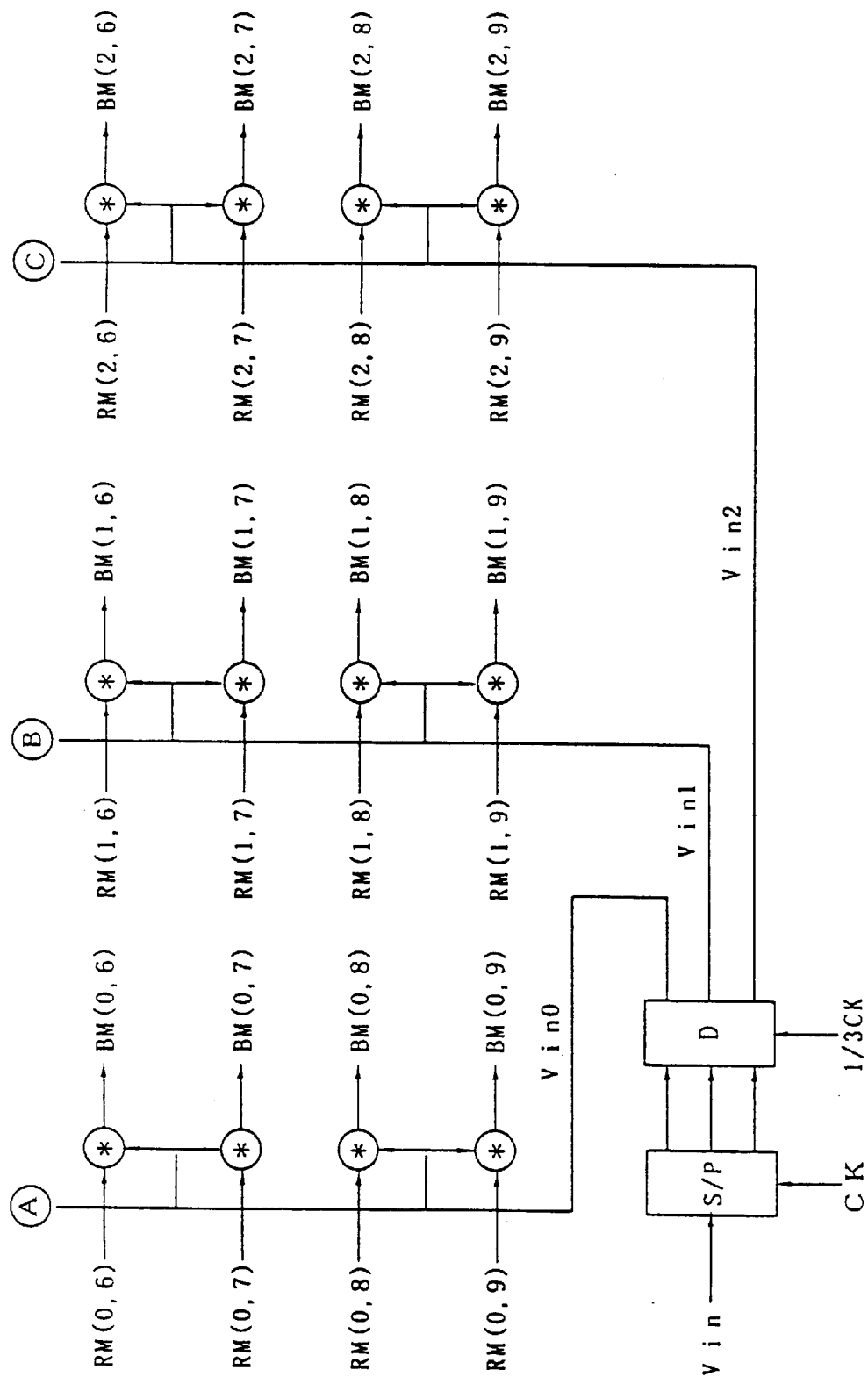
Figure 25:
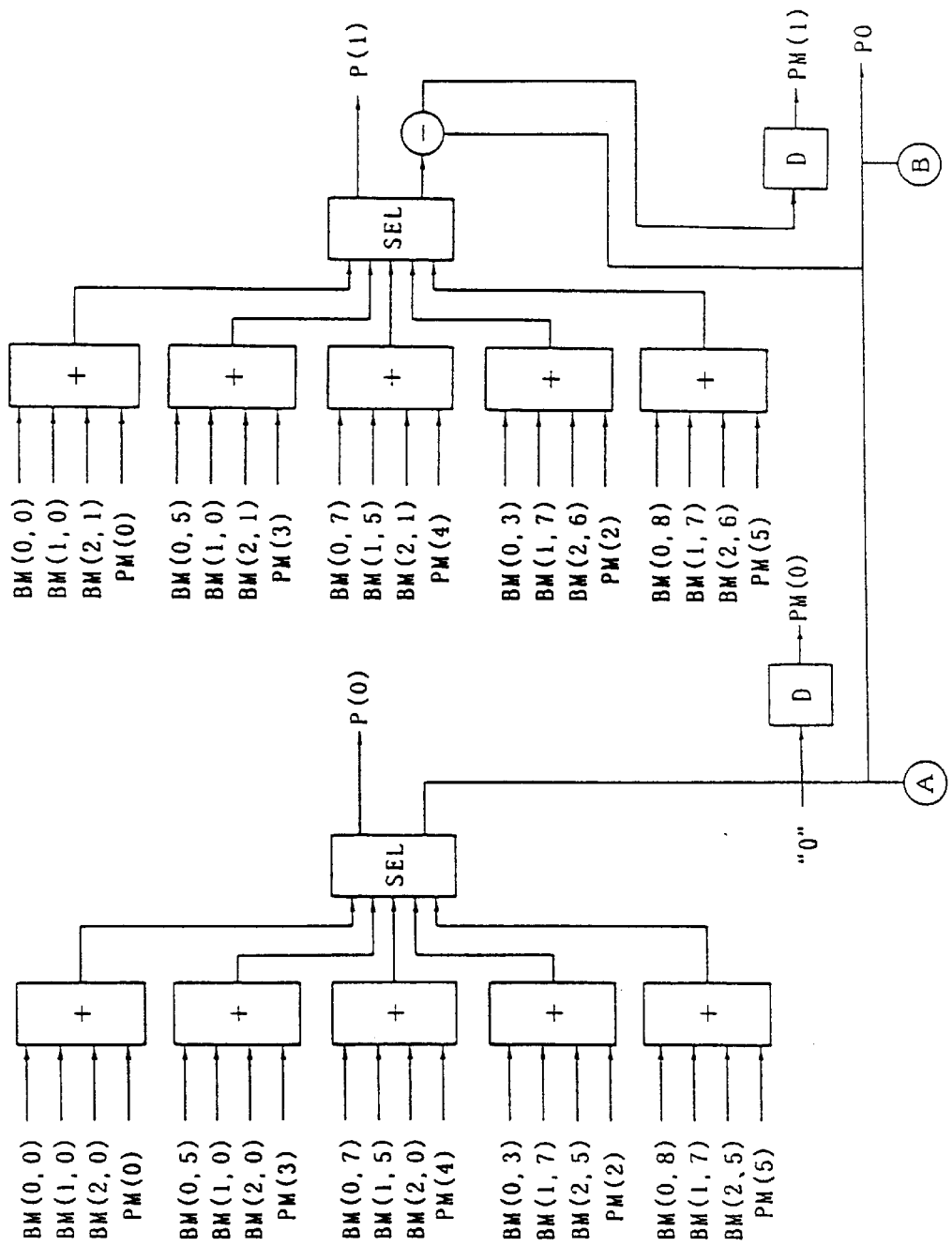
FIGS. 25 and 28 are diagrams showing a comparison and selection circuit for three-clock operation in the tenth embodiment.
Figure 26:
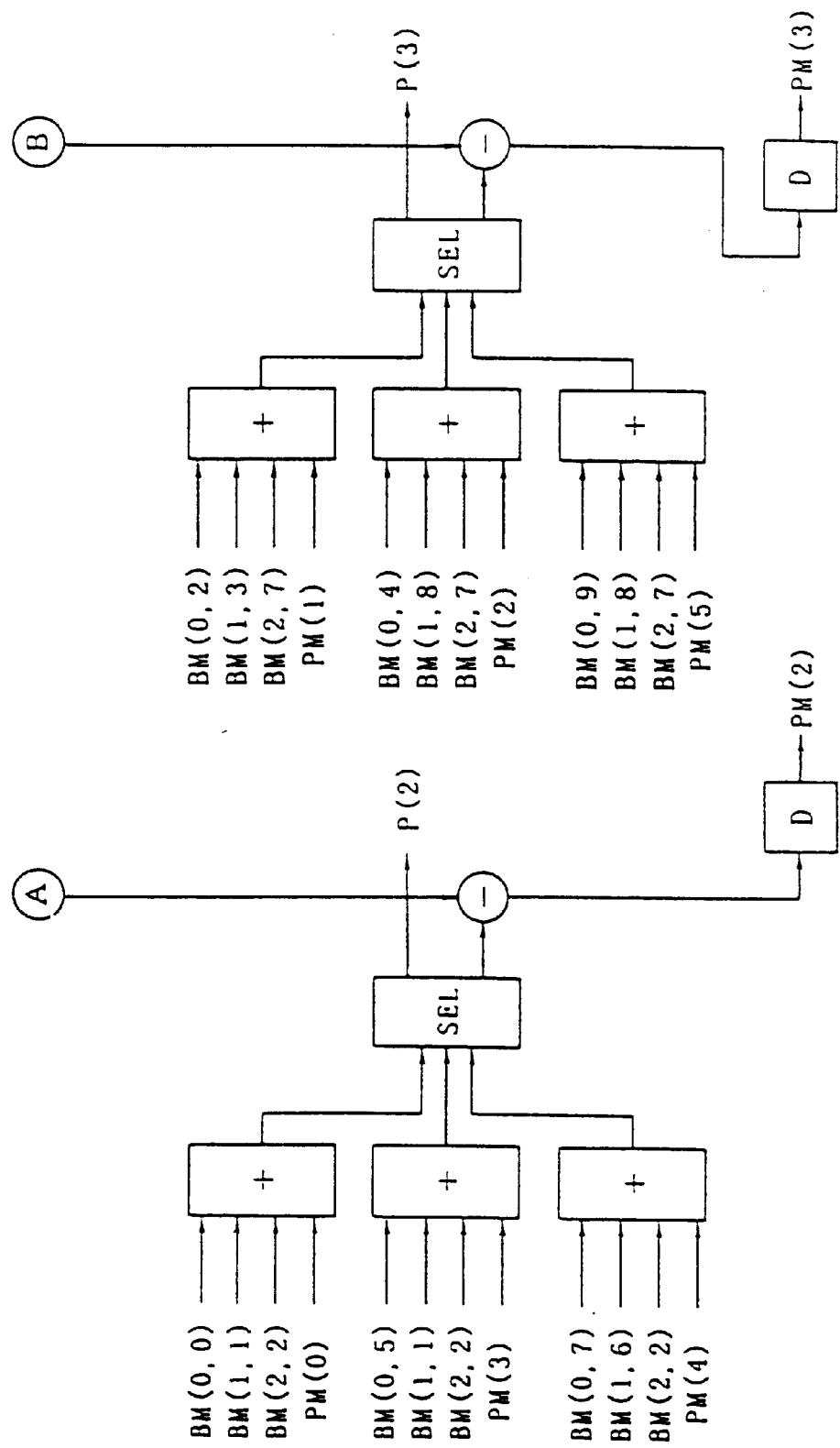
Figure 27:
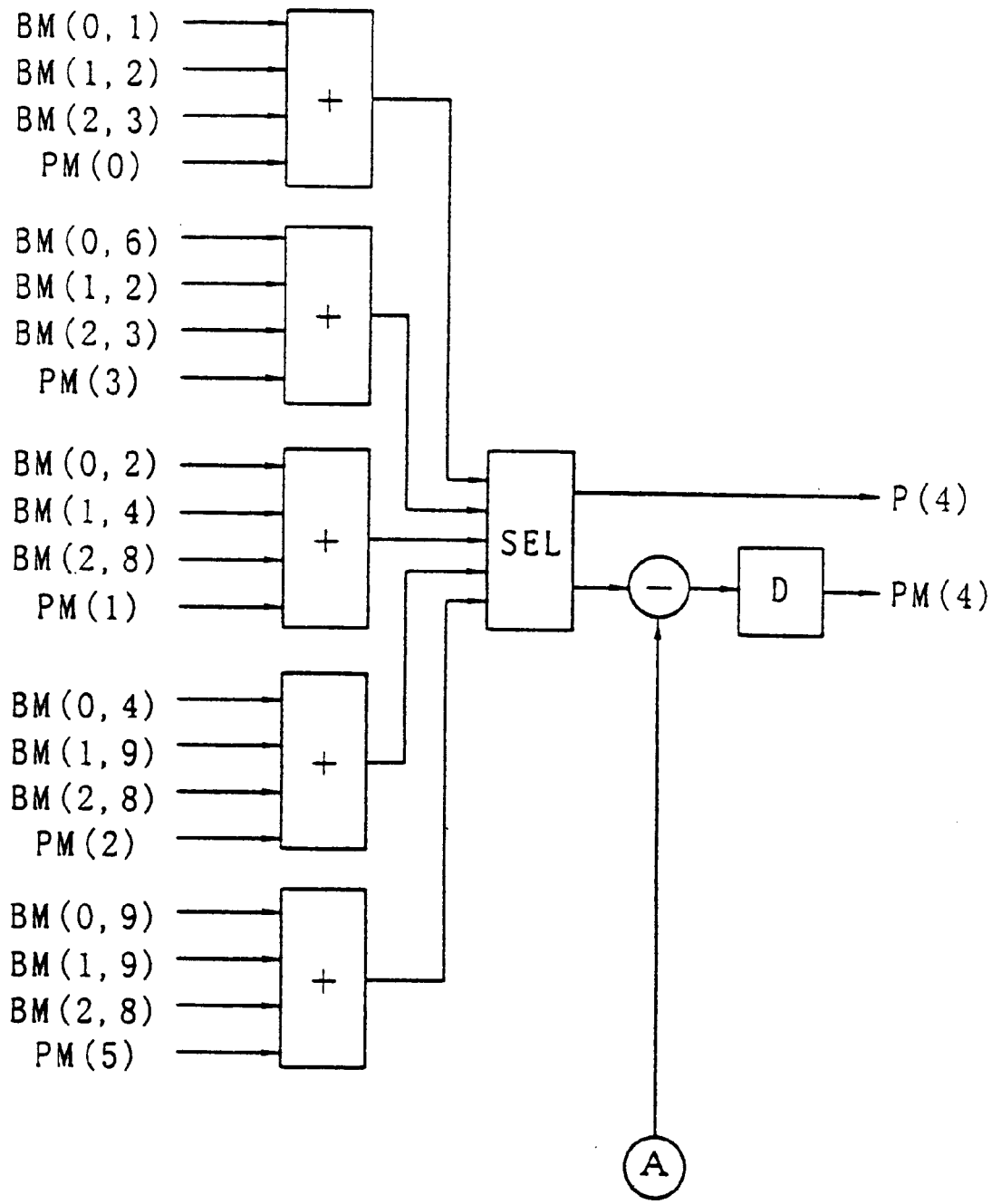
Figure 28:
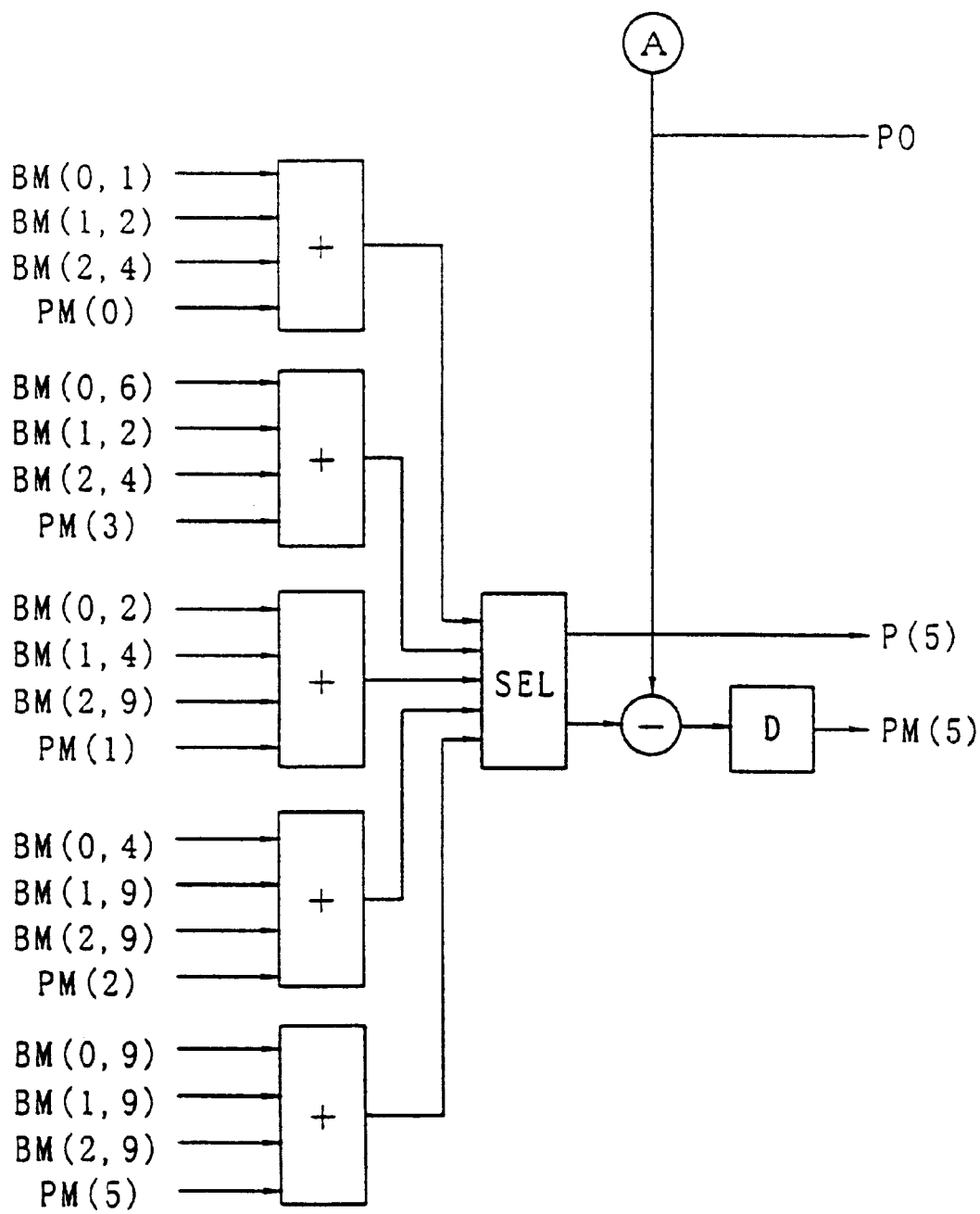

FIGS. 23 and 24 show the three phase developing circuit for input data and branchmetric calculating circuits for respective phase data. FIGS. 23 and 24 are divided for the convenience of drawing.

A ternary input data Vin PR(1,1) pre-equalized is developed into three-phase data Vin0, Vin1 and Vin2 by latching a parallel output of the serial-to-parallel (S/P) converter circuit by using a timing signal of the S/P circuit and 1/3 CK. The three-phase data Vin0, Vin1 and Vin2 are used in calculations with RM(0,0) to RM(0,9), RM(1,0) to RM(1,9) and RM(2,0) to RM(2,9) to output absolute values BM(0,0) to BM(0,9), BM(1,0) to BM(1,9) and BM(2,0) to BM(2,9).

FIGS. 25, 26, 27 and 28 show an example of a composition of the comparison and selection circuit in the tenth embodiment. Pairs of FIGS. 25, 26 and 27, 28 are individually divided for the convenience of drawing.

According to FIGS. 25, 26 and 27, 28, pathmetric calculations and survival path judgements are conducted. Both are circuits for calculations and judgements in FIGS. 21, 22 and equation (6). Also, regarding PM(0) to PM(5), where relative values are important, for example, PM(0) is subtracted from all the path memories to prevent its overflow.

Meanwhile, the survival path informations P(0) to P(5) are corresponding to those where the first terms(time terms) of P(0,0) and so on are omitted. Also, PM(0) to PM(5) after calculation are values 1 CK older than PM(0) to PM(5) before calculation.

Figure 29:
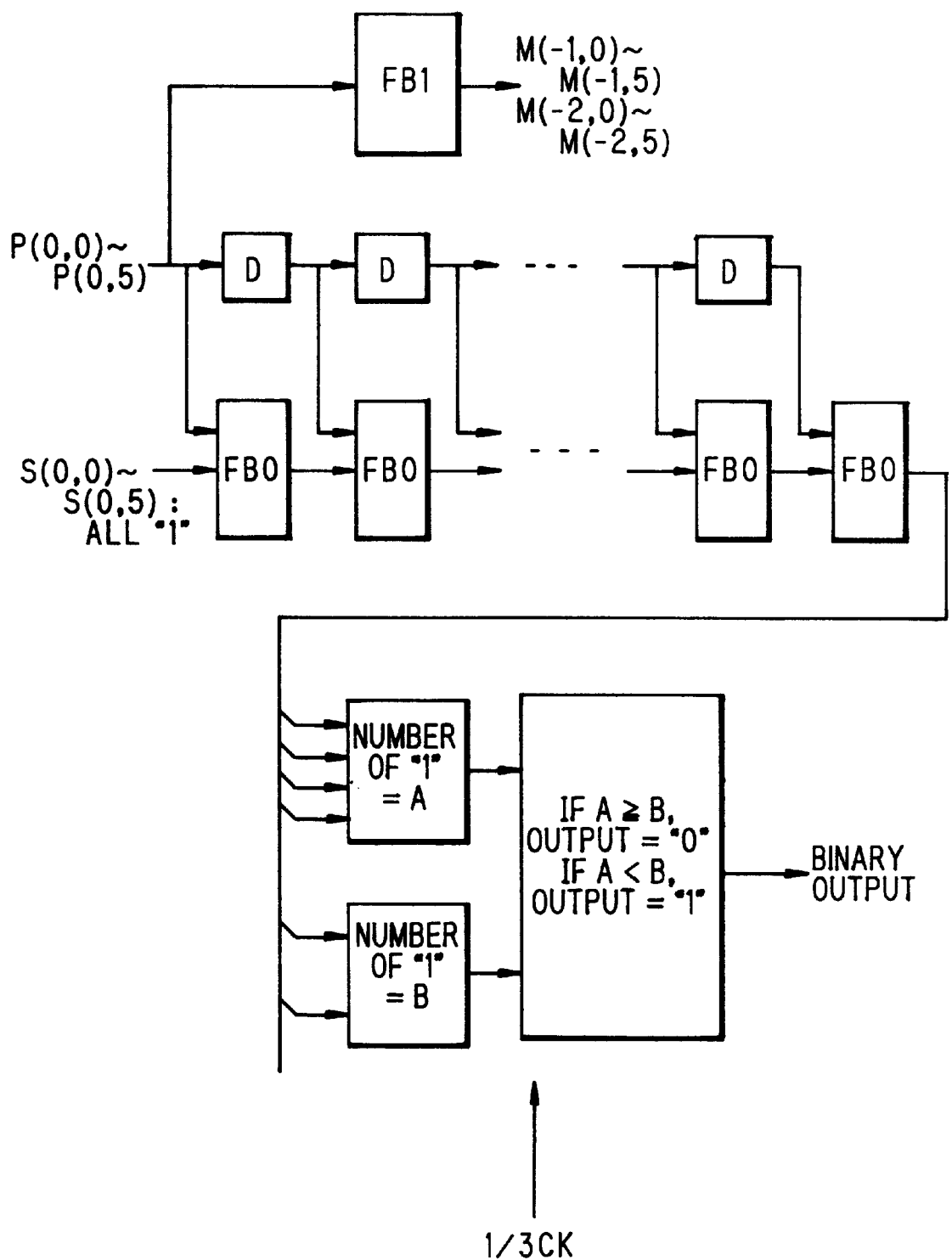
FIG. 29 is a diagram showing a path memory circuit for three-clock operation in the tenth embodiment.
Figure 30:
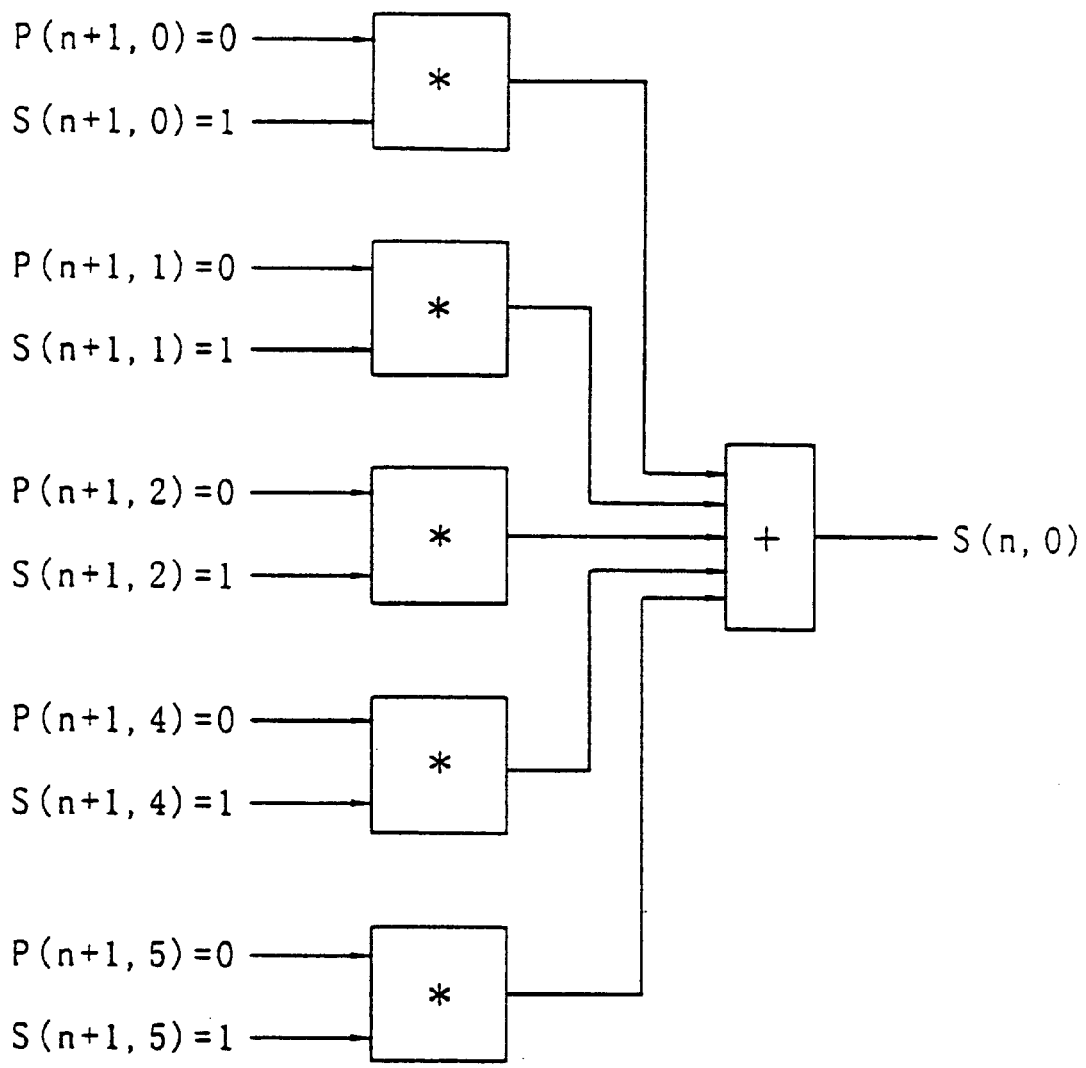
FIGS. 30 to 35 are diagrams showing a FB0 and survival state information calculating circuit for three-clock operation in the tenth embodiment.
Figure 31:
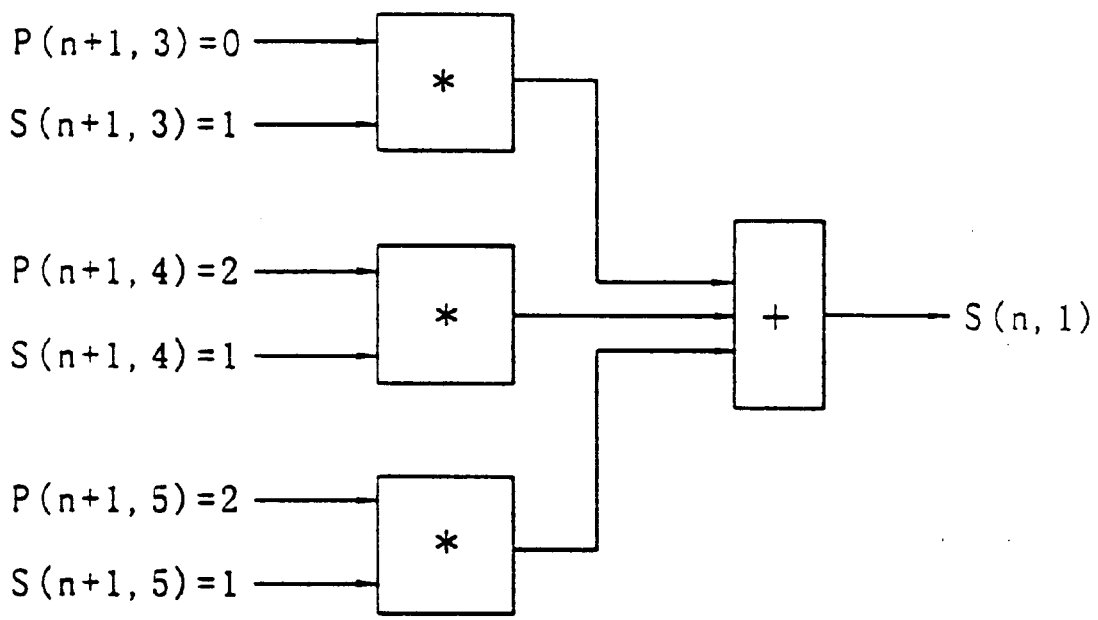
Figure 32:
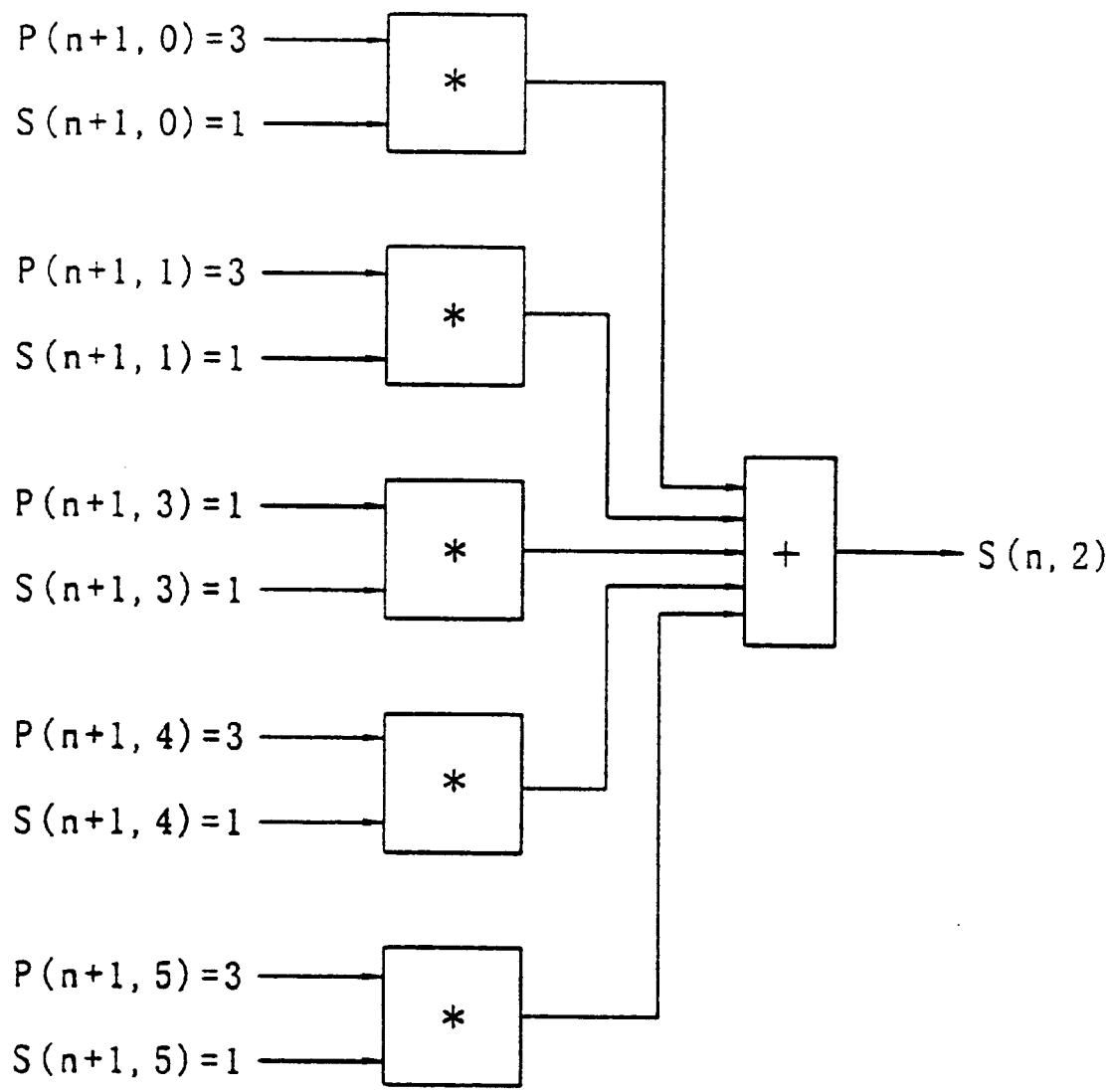
Figure 33:
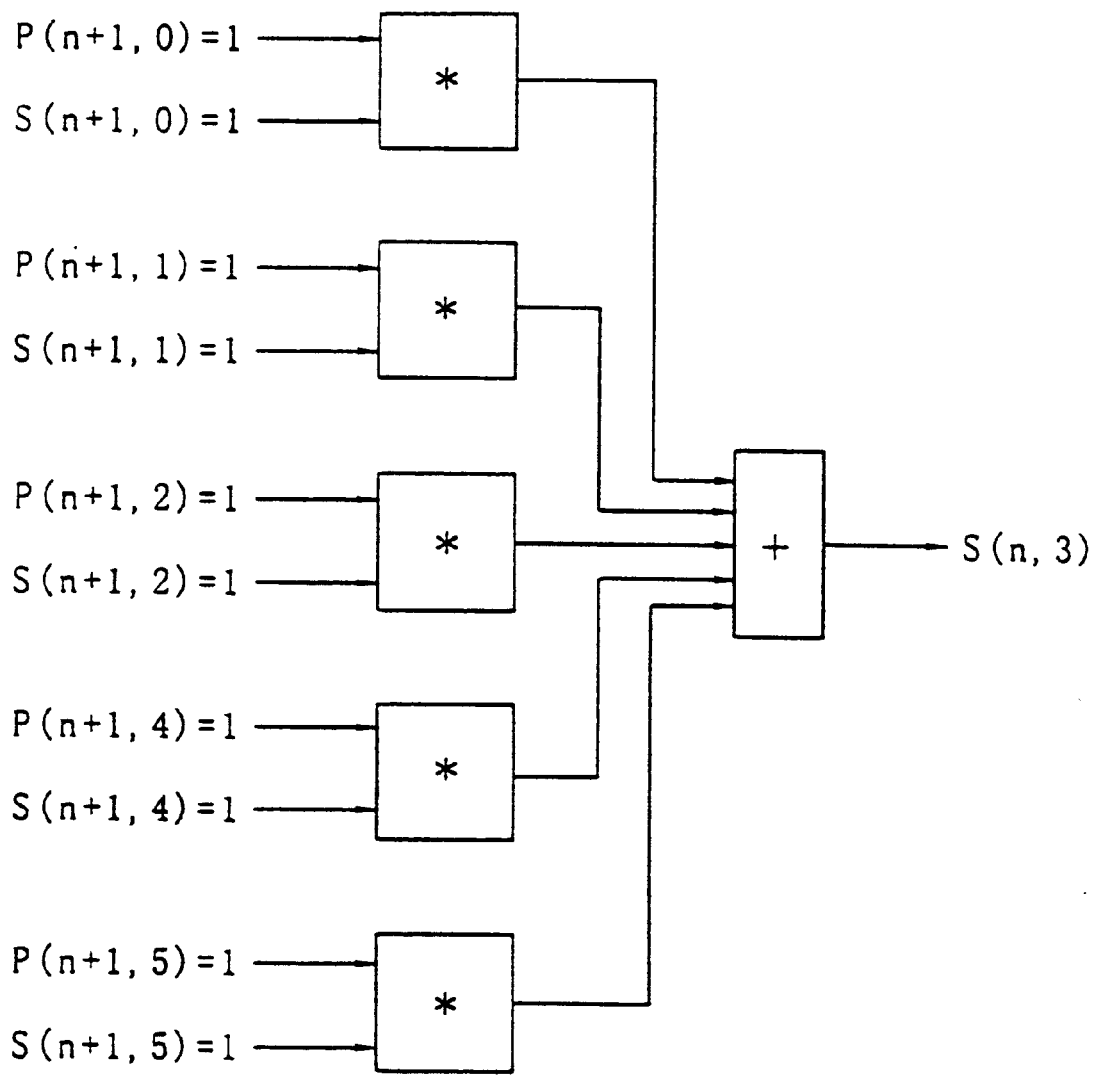
Figure 34:
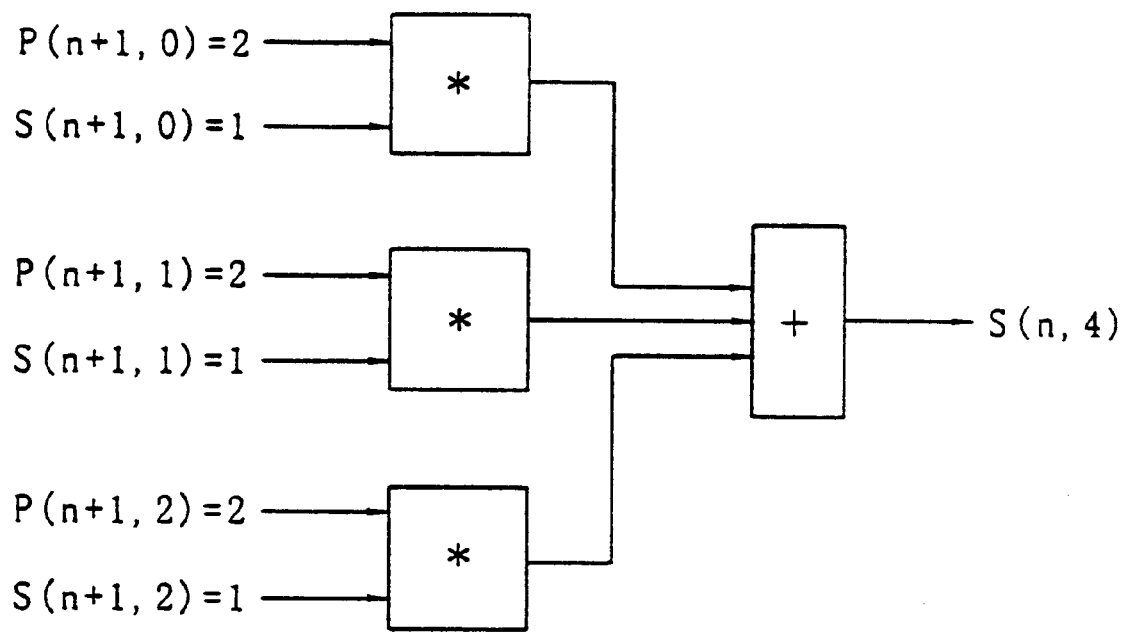
Figure 35:
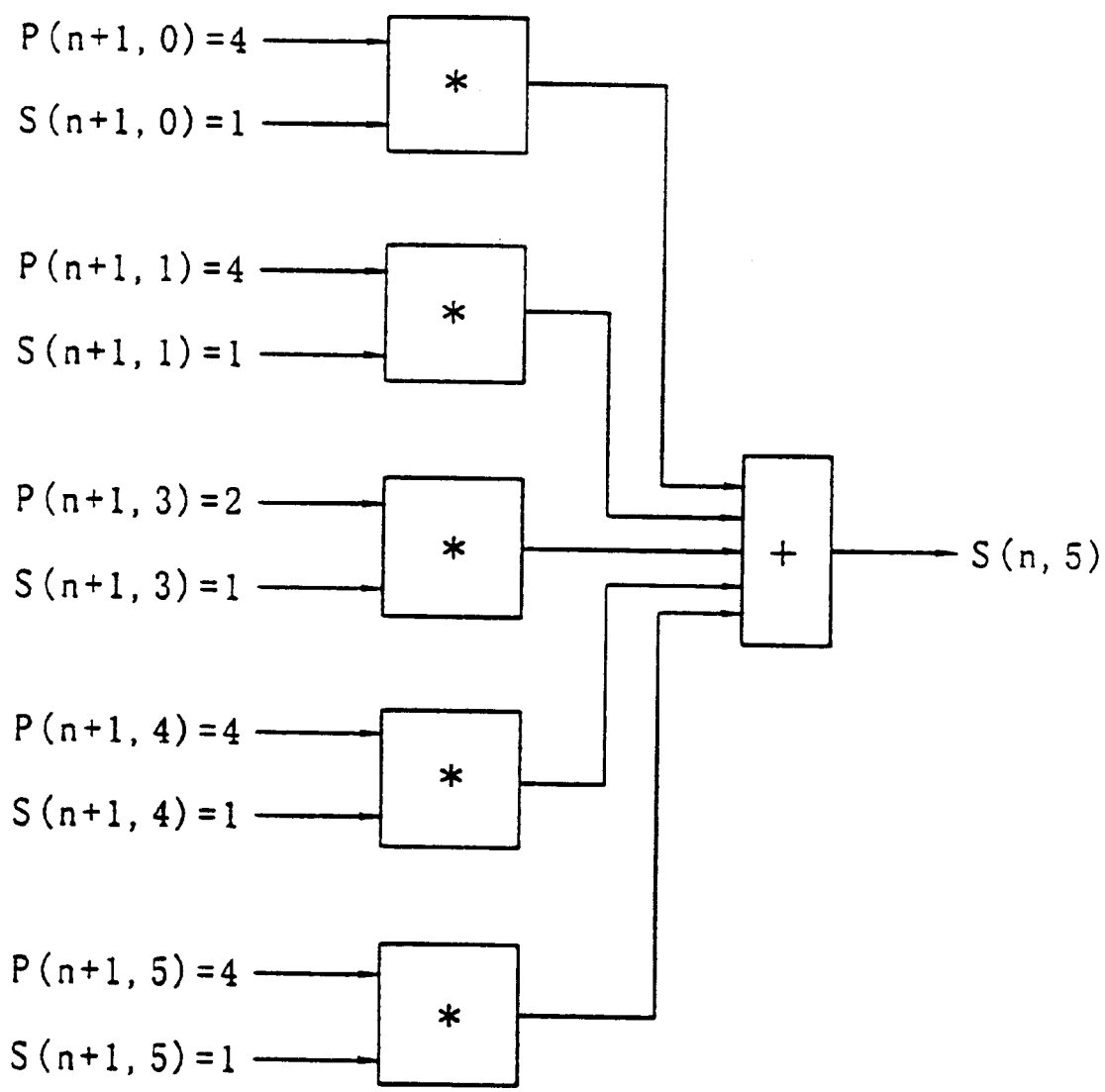

FIG. 29 shows a composition of the path memory circuit. As shown in FIG. 29, in function blocks FB0s, survival path informations P(n+1,0) to P(n+1,5), survival state informations S(n+1,0) to S(n+1,5) are calculated, and, in function blocks FB1s, two-bit previous clock data M(-1,0) to M(-1,5) and M(-2,0) to M(-2,5) are obtained.

FIGS. 30, 31, 32, 33, 34 and 35 show a composition of the function blocks FB0s. FIGS. 30, 31, 32, 33, 34 and 35 are divided for the convenience of drawing.

According to FIGS. 21 and 22, the survival state informations obtained are as follows:

When P(n+1,0)=0 and S(n+1,0)=1 are given, S(n,0)=1 is obtained, or when P(n+1,1)=0 and S(n+1,1)=1 are given, S(n,0)=1 is obtained, or when P(n+1,2)=0 and S(n+1,2)=1 are given, S(n,0)=1 is obtained, or when P(n+1,4)=0 and S(n+1,4)=1 are given, S(n,0)=1 is obtained, or when P(n+1,5)=0 and S(n+1,5)=1 are given, S(n,0)=1 is obtained, and in every other case, S(n,0)=0 is obtained.

When P(n+1,3)=0 and S(n+1,3)=1 are given, S(n,1)=1 is obtained, or when P(n+1,4)=2 and S(n+1,4)=1 are given, S(n,1)=1 is obtained, or when P(n+1,5)=2 and S(n+1,5)=1 are given, S(n,1)=1 is obtained, and in every other case, S(n,1)=0 is obtained.

When P(n+1,0)=3 and S(n+1,0)=1 are given, S(n,2)=1 is obtained, or when P(n+1,1)=3 and S(n+1,1)=1 are given, S(n,2)=1 is obtained, or when P(n+1,3)=1 and S(n+1,3)=1 are given, S(n,2)=1 is obtained, or when P(n+1,4)=3 and S(n+1,4)=1 are given, S(n,2)=1 is obtained, or when P(n+1,5)=3 and S(n+1,5)=1 are given, S(n,2)=1 is obtained, and in every other case, S(n,2)=0 is obtained.

When P(n+1,0)=1 and S(n+1,0)=1 are given, S(n,3)=1 is obtained, or when P(n+1,1)=1 and S(n+1,1)=1 are given, S(n,3)=1 is obtained, or when P(n+1,2)=1 and S(n+1,2)=1 are given, S(n,3)=1 is obtained, or when P(n+1,4)=1 and S(n+1,4)=1 are given, S(n,3)=1 is obtained, or when P(n+1,5)=1 and S(n+1,5)=1 are given, S(n,3)=1 is obtained, and in every other case, S(n,3)=0 is obtained.

When P(n+1,0)=2 and S(n+1,0)=1 are given, S(n,4)=1 is obtained, or when P(n+1,1)=2 and S(n+1,1)=1 are given, S(n,4)=1 is obtained, or when P(n+1,2)=2 and S(n+1,2)=1 are given, S(n,4)=1 is obtained, and in every other case, S(n,4)=0 is obtained.

When P(n+1,0)=4 and S(n+1,0)=1 are given, S(n,5)=1 is obtained, or when P(n+1,1)=4 and S(n+1,1)=1 are given, S(n,5)=1 is obtained, or when P(n+1,3)=2 and S(n+1,3)=1 are given, S(n,5)=1 is obtained, or when P(n+1,4)=4 and S(n+1,4)=1 are given, S(n,5)=1 is obtained, or when P(n+1,5)=4 and S(n+1,5)=1 are given, S(n,5)=1 is obtained, and in every other case, S(n,5)=0 is obtained.

In the function blocks FB1s, for two-bit previous clock data M(-1,0) to M(-1,5) and M(-2,0) to M(-2,5), when reaching states 0, 1 in tracking arrows as to respective states and survival path states in FIGS. 21 and 22, "0" is given, or when reaching states 2, 3, "1" is given, or when reaching states 4, 5, "2" is given. Namely, the two-bit previous clock data given are as follows:

At state 0, if P(0,0)=0, then M(-1,0)=0, M(-2,0)=0 if P(0,0)=1, then M(-1,0)=0, M(-2,0)=0 if P(0,0)=2, then M(-1,0)=0, M(-2,0)=1 if P(0,0)=3, then M(-1,0)=1, M(-2,0)=2 if P(0,0)=4, then M(-1,0)=1, M(-2,0)=2

At state 1, if P(0,1)=0, then M(-1,1)=0, M(-2,1)=0 if P(0,1)=1, then M(-1,1)=0, M(-2,1)=0 if P(0,1)=2, then M(−1,1)=0, M(−2,1)=1
if P(0,1)=3, then M(−1,1)=1, M(−2,1)=2
if P(0,1)=4, then M(−1,1)=1, M(−2,1)=2
At state 2, if P(0,2)=0, then M(−1,2)=0, M(−2,2)=0
if P(0,2)=1, then M(−1,2)=0, M(−2,2)=0
if P(0,2)=2, then M(−1,2)=0, M(−2,2)=1
At state 3, if P(0,3)=0, then M(−1,3)=2, M(−2,3)=1
if P(0,3)=1, then M(−1,3)=2, M(−2,3)=2
if P(0,3)=2, then M(−1,3)=2, M(−2,3)=2
At state 4, if P(0,4)=0, then M(−1,4)=1, M(−2,4)=0
if P(0, 4)=1, then M(−1,4)=1, M(−2,4)=0
if P(0,4)=2, then M(−1,4)=2, M(−2,4)=1
if P(0,4)=3, then M(−1,4)=2, M(−2,4)=2
if P(0,4)=4, then M(−1,4)=2, M(−2,4)=2
At state 5, if P(0,5)=0, then M(−1,5)=1, M(−2,5)=0
if P(0,5)=1, then M(−1,5)=1, M(−2,5)=0
if P(0,5)=2, then M(−1,5)=2, M(−2,5)=1
if P(0,5)=3, then M(−1,5)=2, M(−2,5)=2
if P(0,5)=4, then M(−1,5)=2, M(−2,5)=2

A list of RAM addresses is obtained reducing the composition in FIG. 11 as needed.

RAM has data with addresses of five-bit estimation data composed of a three-clock path and a previous two-clock data.

As shown in FIG. 29, the path memory circuit stores tens of clocks of survival path informations of path memories P(0) to P(5) and calculates six-bit survival state informations. Survival state information at time n is calculated from survival state information at time n+1, i.e., in the future and survival path information.

This calculation is conducted over tens of clocks, therefore survival state information of tens of clocks before is calculated. When one of ten states is on survival state, it means that paths are unified.

When paths are unified to states 0, 1, a ternary output of "0" and a binary final output of "0" are obtained, when paths are unified to states 2, 3, a ternary output of "1" and a binary final output of "1" are obtained, and, when paths are unified to states 4, 5, a ternary output of "2" and a binary final output of "0" are obtained.

However, even when calculating over tens of clocks, paths may not be always unified. If not unified, the number of surviving states of states 0, 1, 4 and 5 are compared with the number of surviving states of states 2, 3. When the former is greater than the latter, a binary final output is to be "0". When the latter is greater than the former, a binary final output is to be "1". When they are equal, it may be "0" or "1".

Finally, the RAM data correcting circuit is similar to the above-mentioned one.

Though, in the above embodiments, the previous clock data are of two bits, it may be of 0 bit, which means using no previous clock data, 1 bit, or 3 bits or more.

For example, for one-bit previous clock data, in case of FIG. 20 where M(−1,0) to M(−1,5) are considered, M(−1, 0)=0 or 1, M(−1,1)=0 or 1, M(−1,2)=0, M(−1, 3)=2, M(−1,4) =1 or 2 and M(−1,5)=1 or 2 are obtained.

Also, for example, for three-bit previous clock data, in case of FIG. 20, they are selected according to equation (7):

$M(-3,0)$ to $M(-1,0)$=000, 100, 210, 121, 221

$M(-3,1)$ to $M(-1,1)$=000, 100, 210, 121, 221

$M(-3,2)$ to $M(-1,2)$=000, 100, 210

$M(-3,3)$ to $M(-1,3)$=012, 122, 222

$M(-3,4)$ to $M(-1,4)$=001, 101, 012, 122, 222

$M(-3,5)$ to $M(-1,5)$=001, 101, 012, 122, 222   7)

Also, M(−1,0) to M(−1,5), M(−2,0) to M(−2,5) and M(−3, 0) to M(−3,5) at respective states are as follows:

At state 0, if P(0,0)=0, then M(−1,0)=0, M(−2,0)=0, M(−3,0)=0
if P(0,0)=1, then M(−1,0)=0, M(−2,0)=0, M(−3,0)=1
if P(0,0)=2, then M(−1,0)=0, M(−2,0)=1, M(−3,0)=2
if P(0,0)=3, then M(−1,0)=1, M(−2,0)=2, M(−3,0)=1
if P(0,0)=4, then M(−1,0)=1, M(−2,0)=2, M(−3,0)=2
At state 1, if P(0,1)=0, then M(−1,1)=0, M(−2,1)=0, M(−3,1)=0
if P(0,1)=1, then M(−1,1)=0, M(−2,1)=0, M(−3,1)=1
if P(0,1)=2, then M(−1,1)=0, M(−2,1)=1, M(−3,1)=2
if P(0,1)=3, then M(−1,1)=1, M(−2,1)=2, M(−3,1)=1
if P(0,1)=4, then M(−1,1)=1, M(−2,1)=2, M(−3,1)=2
At state 2, if P(0,2)=0, then M(−1,2)=0, M(−2,2)=0, M(−3,2)=0
if P(0,2)=1, then M(−1,2)=0, M(−2,2)=0, M(−3,2)=1
if P(0,2)=2, then M(−1,2)=0, M(−2,2)=1, M(−3,2)=2
At state 3, if P(0,3)=0, then M(−1,3)=2, M(−2,3)=1, M(−3,3)=0
if P(0,3)=1, then M(−1,3)=2, M(−2,3)=2, M(−3,3)=1
if P(0,3)=2, then M(−1,3)=2, M(−2,3)=2, M(−3,3)=2
At state 4, if P(0,4)=0, then M(−1,4)=1, M(−2,4)=0, M(−3,4)=0
if P(0,4)=1, then M(−1,4)=1, M(−2,4)=0, M(−3,4)=1
if P(0,4)=2, then M(−1,4)=2, M(−2,4)=1, M(−3,4)=0
if P(0,4)=3, then M(−1,4)=2, M(−2,4)=2, M(−3,4)=1
if P(0,4)=4, then M(−1,4)=2, M(−2,4)=2, M(−3,4)=2
At state 5, if P(0,5)=0, then M(−1,5)=1, M(−2,5)=0, M(−3,5)=0
if P(0,5)=1, then M(−1,5)=1, M(−2,5)=0, M(−3,5)=1
if P(0,5)=2, then M(−1,5)=2, M(−2,5)=1, M(−3,5)=0
if P(0,5)=3, then M(−1,5)=2, M(−2,5)=2, M(−3,5)=1
if P(0,5)=4, then M(−1,5)=2, M(−2,5)=2, M(−3,5)=2

Namely, tracking the past paths, when the paths reach states 0, 1, "0" is obtained, when they reach states 2, 3, "1" is obtained, and, when they reach states 4, 5, "2" is obtained.

The above alterations are similarly adaptable to the first to ninth embodiments in FIGS. 1 and 12 to 19.

Further, in the above embodiments, the pre-equalization may be PR(1) ternary value detection. Also, a detection system where a ternary waveform close to PR(1,1), PR(1) is obtained maybe used. Even when an error gap in pre-equalization occurs, e.g., even in case of substantially PR(0.8, 1.2), PR(1.3, 0.9) or PR(0.1, 1.2, 0.2), the invention can be adapted since a equalization error can be corrected.

Furthermore, even when quite different equalizations are conducted, the invention can be adapted in the case that its state change is similar to those in FIG. 1 and FIGS. 12 to 19. For example, when PR(1) binary detection, PR(1,1) binary detection and a detection system that a binary waveform close to those can be obtained are conducted, changing the states and PM(0) to PM(5) from the two-clock data in FIG. 15 into three-clock data as shown below, and changing the paths and BM(0) to BM(9) from the three-clock data in FIG. 15 into four-clock data as shown below can be conducted:

| | |
|---|---|
| PM(0) 00 → 000 | BM(0) 000 → 0000 |
| PM(1) 01 → 001 | BM(1) 001 → 0001 |
| PM(2) 12 → 011 | BM(2) 012 → 0011 |
| PM(3) 10 → 100 | BM(3) 121 → 0110 |
| PM(4) 21 → 110 | BM(4) 122 → 0111 |
| PM(5) 22 → 111 | BM(5) 100 → 1000 |
| | BM(6) 101 → 1001 |
| | BM(7) 210 → 1100 |
| | BM(8) 221 → 1110 |
| | BM(9) 222 → 1111 |

Namely, FIG. 15 can be used as it is, and FIGS. 20 to 30, 31, 32, 33, 34 and 35 can be also used by altering some data.

Also in the first to ninth embodiments in FIG. 1 and FIGS. 12 to 19, these are similarly applicable, where the other equalization systems can be used.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A data reproducing device, the device having a plurality of defined states with paths between the states, a negative logarithm of a probability to reach a state comprising a pathmetric and a negative logarithm of a probability that an input corresponds to a path comprising a branchmetric, the device comprising:

means for comparing values wherein said branchmetric and a previously calculated pathmetric are added, selecting a smaller one of said values as the result of comparing, and outputting said smaller one of said values as a new pathmetric as well as a selection signal as to which of said values is selected;

path memory circuit which stores said selection signal over several stages, obtaining a most possible path by unifying paths, then outputting a most possible data;

a storage means for outputting an estimation data judged to be closest to said pre-equalized reproduction data by using a present output of said path memory circuit as an address; and a data correcting means for renewing an internal data of said storage means based upon a data obtained by delaying said pre-equalized reproducing data by a predetermined value and said internal data of said storage means obtained by using a continuous output data of said path memory circuit.

2. A data-reproducing device, according to claim 1, wherein:

to all states, new temporary pathmetrics are calculated by adding a branchmetric from a previous clock to a present clock to a pathmetric at said previous clock as to two paths linking from a previous clock, and a smaller one of said new temporary pathmetrics is selected as a new pathmetric;

a survival state at said previous clock can be judged from a survival path information corresponding to a data as to which of said new temporary pathmetrics is selected as said new pathmetric;

a L-bit previous clock data, where $L \geq 0$ is to be satisfied, and path unification can be judged by tracking said survival state at said previous clock to the past;

a binary final output is given corresponding to said survival state where path unification is achieved; and a binary final output is given by deciding a majority between the number of surviving states to a binary final output of "0" and the number of surviving states to a binary final output of "1", when path unification is not achieved.

3. A data-reproducing device, according to claim 1, wherein:

a recording code with a minimum inversion interval of 2 is used;

a PR(1,1) pre-equalization where said pre-equalized reproduction data is represented by a ternary value(0, 1, 2) is used; and to all states, paths except an impossible sequence of "1", "02", "20", "010" and "212" are calculated.

4. A data-reproducing device, according to claim 2, wherein:

a recording code with a minimum inversion interval of 2 is used;

a PR(1,1) pre-equalization where said pre-equalized reproduction data is represented by a ternary value(0, 1, 2) is used; and to all states, paths except an impossible sequence of "1", "02", "20", "010" and "212" are calculated.

5. A data-reproducing device, according to claim 1, wherein:

a recording code with a minimum inversion interval of 3 is used;

a PR(1,1) pre-equalization where said pre-equalized reproduction data is represented by a ternary value(0, 1, 2) is used; and to all states, paths except an impossible sequence of "1", "02", "20", "010", "212", "101" and "121" are calculated.

6. A data-reproducing device, according to claim 2, wherein:

a recording code with a minimum inversion interval of 3 is used;

a PR(1,1) pre-equalization where said pre-equalized reproduction data is represented by a ternary value(0, 1, 2) is used; and to all states, paths except an impossible sequence of "1", "02", "20", "010", "212", "101" and "121" are calculated.

7. A data-reproducing device, according to claim 1, wherein:

a PR(1,1) pre-equalization where said pre-equalized reproduction data is represented by a ternary value(0, 1, 2) is used; and said branchmetric is of three-clock data including 000, 001, 011, 012, 100, 101, 110, 111, 112, 121, 122, 210, 211, 221 and 222.

8. A data-reproducing device, according to claim 2, wherein:

a PR(1,1) pre-equalization where said pre-equalized reproduction data is represented by a ternary value (0, 1, 2) is used; and said branchmetric is of three-clock data including 000, 001, 011, 012, 100, 101, 110, 111, 112, 121, 122, 210, 211, 221 and 222.

9. A data-reproducing device, according to claim 1, wherein:

a recording code with a minimum inversion interval of 2 is used;

a PR(1,1) pre-equalization where said pre-equalized reproduction data is represented by a ternary value(0, 1, 2) is used; and said branchmetric is of three-clock data including 000, 001, 012, 100, 101, 121, 122, 210, 221 and 222.

10. A data-reproducing device, according to claim 2, wherein:
a recording code with a minimum inversion interval of 2 is used;
a PR(1,1) pre-equalization where said pre-equalized reproduction data is represented by a ternary value(0, 1, 2) is used; and
said branchmetric is of three-clock data including 000, 001, 012, 100, 101, 121, 122, 210, 221 and 222.

11. A data-reproducing device, according to claim 3, wherein:
a recording code with a minimum inversion interval of 2 is used;
a PR(1,1) pre-equalization where said pre-equalized reproduction data is represented by a ternary value(0, 1, 2) is used; and
said branchmetric is of three-clock data including 000, 001, 012, 100, 101, 121, 122, 210, 221 and 222.

12. A data-reproducing device, according to claim 4, wherein:
a recording code with a minimum inversion interval of 2 is used;
a PR(1,1) pre-equalization where said pre-equalized reproduction data is represented by a ternary value(0, 1, 2) is used; and
said branchmetric is of three-clock data including 000, 001, 012, 100, 101, 121, 122, 210, 221 and 222.

13. A data-reproducing device, according to claim 1, wherein:
a recording code with a minimum inversion interval of 3 is used;
a PR(1,1) pre-equalization where said pre-equalized reproduction data is represented by a ternary value(0, 1, 2) is used; and
said branchmetric is of three-clock data including 000, 001, 012, 100, 122, 210, 221 and 222.

14. A data-reproducing device, according to claim 2, wherein:
a recording code with a minimum inversion interval of 3 is used;
a PR(1,1) pre-equalization where said pre-equalized reproduction data is represented by a ternary value(0, 1, 2) is used; and
said branchmetric is of three-clock data including 000, 001, 012, 100, 122, 210, 221 and 222.

15. A data-reproducing device, according to claim 5, wherein:
a recording code with a minimum inversion interval of 3 is used;
a PR(1,1) pre-equalization where said pre-equalized reproduction data is represented by a ternary value(0, 1, 2) is used; and
said branchmetric is of three-clock data including 000, 001, 012, 100, 122, 210, 221 and 222.

16. A data-reproducing device, according to claim 6, wherein:
a recording code with a minimum inversion interval of 3 is used;
a PR(1,1) pre-equalization where said pre-equalized reproduction data is represented by a ternary value(0, 1, 2) is used; and
said branchmetric is of three-clock data including 000, 001, 012, 100, 122, 210, 221 and 222.

17. A data-reproducing device, according to claim 1, wherein:
a PR(1,1) pre-equalization where said pre-equalized reproduction data is represented by a ternary value(0, 1, 2) is used; and
said branchmetric is of four-clock data including 0000, 0001, 0011, 0012, 0110, 0111, 0121, 0122, 1000, 1001, 1011, 1012, 1100, 1101, 1110, 1111, 1112, 1121, 1122, 1210, 1211, 1221, 1222, 2100, 2101, 2111, 2112, 2210, 2211, 2221 and 2222.

18. A data-reproducing device, according to claim 2, wherein:
a PR(1,1) pre-equalization where said pre-equalized reproduction data is represented by a ternary value(0, 1, 2) is used; and
said branchmetric is of four-clock data including 0000, 0001, 0011, 0012, 0110, 0111, 0121, 0122, 1000, 1001, 1011, 1012, 1100, 1101, 1110, 1111, 1112, 1121, 1122, 1210, 1211, 1221, 1222, 2100, 2101, 2111, 2112, 2210, 2211, 2221 and 2222.

19. A data-reproducing device, according to claim 1, wherein:
a recording code with a minimum inversion interval of 2 is used;
a PR(1,1) pre-equalization where said pre-equalized reproduction data is represented by a ternary value(0, 1, 2) is used; and
said branchmetric is of four-clock data including 0000, 0001, 0012, 0121, 0122, 1000, 1001, 1012, 1210, 1221, 1222, 2100, 2101, 2210, 2221 and 2222.

20. A data-reproducing device, according to claim 2, wherein:
a recording code with a minimum inversion interval of 2 is used;
a PR(1,1) pre-equalization where said pre-equalized reproduction data is represented by a ternary value(0, 1, 2) is used; and
said branchmetric is of four-clock data including 0000, 0001, 0012, 0121, 0122, 1000, 1001, 1012, 1210, 1221, 1222, 2100, 2101, 2210, 2221 and 2222.

21. A data-reproducing device, according to claim 3, wherein:
a recording code with a minimum inversion interval of 2 is used;
a PR(1,1) pre-equalization where said pre-equalized reproduction data is represented by a ternary value(0, 1, 2) is used; and
said branchmetric is of four-clock data including 0000, 0001, 0012, 0121, 0122, 1000, 1001, 1012, 1210, 1221, 1222, 2100, 2101, 2210, 2221 and 2222.

22. A data-reproducing device, according to claim 4, wherein:
a recording code with a minimum inversion interval of 2 is used;
a PR(1,1) pre-equalization where said pre-equalized reproduction data is represented by a ternary value(0, 1, 2) is used; and
said branchmetric is of four-clock data including 0000, 0001, 0012, 0121, 0122, 1000, 1001, 1012, 1210, 1221, 1222, 2100, 2101, 2210, 2221 and 2222.

23. A data-reproducing device, according to claim 1, wherein:

a recording code with a minimum inversion interval of 3 is used;

a PR(1,1) pre-equalization where said pre-equalized reproduction data is represented by a ternary value(0, 1, 2) is used; and said branchmetric is of four-clock data including 0000, 0001, 0012, 0122, 1000, 1001, 1221, 1222, 2100, 2210, 2221 and 2222.

24. A data-reproducing device, according to claim 2, wherein:

a recording code with a minimum inversion interval of 3 is used;

a PR(1,1) pre-equalization where said pre-equalized reproduction data is represented by a ternary value(0, 1, 2) is used; and said branchmetric is of four-clock data including 0000, 0001, 0012, 0122, 1000, 1001, 1221, 1222, 2100, 2210, 2221 and 2222.

25. A data-reproducing device, according to claim 5, wherein:

a recording code with a minimum inversion interval of 3 is used;

a PR(1,1) pre-equalization where said pre-equalized reproduction data is represented by a ternary value(0, 1, 2) is used; and said branchmetric is of four-clock data including 0000, 0001, 0012, 0122, 1000, 1001, 1221, 1222, 2100, 2210, 2221 and 2222.

26. A data-reproducing device, according to claim 6, wherein:

a recording code with a minimum inversion interval of 3 is used;

a PR(1,1) pre-equalization where said pre-equalized reproduction data is represented by a ternary value(0, 1, 2) is used; and said branchmetric is of four-clock data including 0000, 0001, 0012, 0122, 1000, 1001, 1221, 1222, 2100, 2210, 2221 and 2222.

27. A data-reproducing device, according to claim 1, wherein:

a recording code with a minimum inversion interval of 2 is used;

a PR(1,1) pre-equalization where said pre-equalized reproduction data is represented by a ternary value(0, 1, 2) is used; and said branchmetric is of five-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

28. A data-reproducing device, according to claim 2, wherein:

a recording code with a minimum inversion interval of 2 is used;

a PR(1,1) pre-equalization where said pre-equalized reproduction data is represented by a ternary value(0, 1, 2) is used; and said branchmetric is of five-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

29. A data-reproducing device, according to claim 3, wherein:

a recording code with a minimum inversion interval of 2 is used;

a PR(1,1) pre-equalization where said pre-equalized reproduction data is represented by a ternary value(0, 1, 2) is used; and said branchmetric is of five-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

30. A data-reproducing device, according to claim 4, wherein:

a recording code with a minimum inversion interval of 2 is used;

a PR(1,1) pre-equalization where said pre-equalized reproduction data is represented by a ternary value(0, 1, 2) is used; and said branchmetric is of five-clock data including 00000, 00001, 00012, 00121, 00122, 01210, 01221, 01222, 10000, 10001, 10012, 10121, 10122, 12100, 12101, 12210, 12221, 12222, 21000, 21001, 21012, 22100, 22101, 22210, 22221 and 22222.

31. A data-reproducing device, according to claim 1, wherein:

a recording code with a minimum inversion interval of 3 is used;

a PR(1,1) pre-equalization where said pre-equalized reproduction data is represented by a ternary value(0, 1, 2) is used; and said branchmetric is of five-clock data including 00000, 00001, 00012, 00122, 01221, 01222, 10000, 10001, 10012, 12210, 12221, 12222, 21000, 21001, 22100, 22210, 22221 and 22222.

32. A data-reproducing device, according to claim 2, wherein:

a recording code with a minimum inversion interval of 3 is used;

a PR(1,1) pre-equalization where said pre-equalized reproduction data is represented by a ternary value(0, 1, 2) is used; and said branchmetric is of five-clock data including 00000, 00001, 00012, 00122, 01221, 01222, 10000, 10001, 10012, 12210, 12221, 12222, 21000, 21001, 22100, 22210, 22221 and 22222.

33. A data-reproducing device, according to claim 5, wherein:

a recording code with a minimum inversion interval of 3 is used;

a PR(1,1) pre-equalization where said pre-equalized reproduction data is represented by a ternary value(0, 1, 2) is used; and said branchmetric is of five-clock data including 00000, 00001, 00012, 00122, 01221, 01222, 10000, 10001, 10012, 12210, 12221, 12222, 21000, 21001, 22100, 22210, 22221 and 22222.

34. A data-reproducing device, according to claim 6, wherein:

a recording code with a minimum inversion interval of 3 is used;

a PR(1,1) pre-equalization where said pre-equalized reproduction data is represented by a ternary value(0, 1, 2) is used; and said branchmetric is of five-clock data including 00000, 00001, 00012, 00122, 01221, 01222, 10000, 10001, 10012, 12210, 12221, 12222, 21000, 21001, 22100, 22210, 22221 and 22222.

35. A data-reproducing device, according to claim 1, wherein:

a recording code with a minimum inversion interval of 3 is used;

a PR(1,1) pre-equalization where said pre-equalized reproduction data is represented by a ternary value(0, 1, 2) is used; and said branchmetric is of six-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

36. A data-reproducing device, according to claim 2, wherein:

a recording code with a minimum inversion interval of 3 is used;

a PR(1,1) pre-equalization where said pre-equalized reproduction data is represented by a ternary value(0, 1, 2) is used; and said branchmetric is of six-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

37. A data-reproducing device, according to claim 5, wherein:

a recording code with a minimum inversion interval of 3 is used;

a PR(1,1) pre-equalization where said pre-equalized reproduction data is represented by a ternary value(0, 1, 2) is used; and said branchmetric is of six-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

38. A data-reproducing device, according to claim 6, wherein:

a recording code with a minimum inversion interval of 3 is used;

a PR(1,1) pre-equalization where said pre-equalized reproduction data is represented by a ternary value(0, 1, 2) is used; and said branchmetric is of six-clock data including 000000, 000001, 000012, 000122, 001221, 001222, 012210, 012221, 012222, 100000, 100001, 100012, 100122, 122100, 122210, 122221, 122222, 210000, 210001, 210012, 221000, 221001, 222100, 222210, 222221 and 222222.

39. A data-reproducing device, according to claim 1, wherein:

a PR(1,1) pre-equalization where said pre-equalized reproduction data is represented by a ternary value(0, 1, 2) is used; and said branchmetric is of two-clock data.

40. A data-reproducing device, according to claim 2, wherein:

a PR(1,1) pre-equalization where said pre-equalized reproduction data is represented by a ternary value(0, 1, 2) is used; and said branchmetric is of two-clock data.

41. A data-reproducing device, according to claim 3, wherein:

a PR(1,1) pre-equalization where said pre-equalized reproduction data is represented by a ternary value(0, 1, 2) is used; and said branchmetric is of two-clock data.

42. A data-reproducing device, according to claim 4, wherein:

a PR(1,1) pre-equalization where said pre-equalized reproduction data is represented by a ternary value(0, 1, 2) is used; and said branchmetric is of two-clock data.

43. A data-reproducing device, according to claim 5, wherein:

a PR(1,1) pre-equalization where said pre-equalized reproduction data is represented by a ternary value(0, 1, 2) is used; and said branchmetric is of two-clock data.

44. A data-reproducing device, according to claim 6, wherein:

a PR(1,1) pre-equalization where said pre-equalized reproduction data is represented by a ternary value(0, 1, 2) is used; and said branchmetric is of two-clock data.

45. A data-reproducing device, according to claim 1, wherein:

a PR(1,1) pre-equalization where said pre-equalized reproduction data is represented by a ternary value(0, 1, 2) is used; and, 1) said branchmetric is of five or more clock data, 2) a recording code with a minimum inversion interval of 2 is used and said branchmetric is of six or more clock data, or 3) a recording code with a minimum inversion interval of 3 is used and said branchmetric is of seven or more clock data.

46. A data-reproducing device, according to claim 2, wherein:

a PR(1,1) pre-equalization where said pre-equalized reproduction data is represented by a ternary value(0, 1, 2) is used; and, 1) said branchmetric is of five or more clock data, 2) a recording code with a minimum inversion interval of 2 is used and said branchmetric is of six or more clock data, or 3) a recording code with a minimum inversion interval of 3 is used and said branchmetric is of seven or more clock data.

47. A data-reproducing device, according to claim 3, wherein:

a PR(1,1) pre-equalization where said pre-equalized reproduction data is represented by a ternary value(0, 1, 2) is used; and, 1) said branchmetric is of five or more clock data, 2) a recording code with a minimum inversion interval of 2 is used and said branchmetric is of six or more clock data, or 3) a recording code with a minimum inversion interval of 3 is used and said branchmetric is of seven or more clock data.

48. A data-reproducing device, according to claim 4, wherein:

a PR(1,1) pre-equalization where said pre-equalized reproduction data is represented by a ternary value(0, 1, 2) is used; and, 1) said branchmetric is of five or more clock data,
2) a recording code with a minimum inversion interval of 2 is used and said branchmetric is of six or more clock data, or
3) a recording code with a minimum inversion interval of 3 is used and said branchmetric is of seven or more clock data.

49. A data-reproducing device, according to claim 5, wherein:
  a PR(1,1) pre-equalization where said pre-equalized reproduction data is represented by a ternary value(0, 1, 2) is used; and,
  1) said branchmetric is of five or more clock data,
  2) a recording code with a minimum inversion interval of 2 is used and said branchmetric is of six or more clock data, or
  3) a recording code with a minimum inversion interval of 3 is used and said branchmetric is of seven or more clock data.

50. A data-reproducing device, according to claim 6, wherein:
  a PR(1,1) pre-equalization where said pre-equalized reproduction data is represented by a ternary value(0, 1, 2) is used; and,
  1) said branchmetric is of five or more clock data,
  2) a recording code with a minimum inversion interval of 2 is used and said branchmetric is of six or more clock data, or
  3) a recording code with a minimum inversion interval of 3 is used and said branchmetric is of seven or more clock data.

51. A data-reproducing device, according to claim 1, wherein:
  reproduction data after pre-equalization are developed into K-phase data, where K>1 is to be satisfied, said K-phase data are processed by a clock with a frequency of 1/K.

52. A data-reproducing device, according to claim 2, wherein:
  reproduction data after pre-equalization are developed into K-phase data, where K>1 is to be satisfied, said K-phase data are processed by a clock with a frequency of 1/K.

53. A data-reproducing device, according to claim 3, wherein:
  reproduction data after pre-equalization are developed into K-phase data, where K>1 is to be satisfied, said K-phase data are processed by a clock with a frequency of 1/K.

54. A data-reproducing device, according to claim 4, wherein:
  reproduction data after pre-equalization are developed into K-phase data, where K>1 is to be satisfied, said K-phase data are processed by a clock with a frequency of 1/K.

55. A data-reproducing device, according to claim 5, wherein:
  reproduction data after pre-equalization are developed into K-phase data, where K>1 is to be satisfied, said K-phase data are processed by a clock with a frequency of 1/K.

56. A data-reproducing device, according to claim 6, wherein:
  reproduction data after pre-equalization are developed into K-phase data, where K>1 is to be satisfied, said K-phase data are processed by a clock with a frequency of 1/K.

57. A data-reproducing device, according to claim 1, wherein:
  to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
  a survival state at K clocks before can be judged from a survival path information corresponding to a data as to which of said two to the K-th power paths is selected;
  a L-bit previous clock data, where $L \geq 0$ is to be satisfied, and path unification can be judged by tracking said survival state by clocks twice K to the past;
  a binary final output is given corresponding to said survival state where path unification is achieved; and
  a binary final output is given by deciding a majority between the number of surviving states to a binary final output of "0" and the number of surviving states to a binary final output of "1", when path unification is not achieved.

58. A data-reproducing device, according to claim 51, wherein:
  to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
  a survival state at K clocks before can be judged from a survival path information corresponding to a data as to which of said two to the K-th power paths is selected;
  a L-bit previous clock data, where L>0 is to be satisfied, and path unification can be judged by tracking said survival state by clocks twice K to the past;
  a binary final output is given corresponding to said survival state where path unification is achieved; and a binary final output is given by deciding a majority between the number of surviving states to a binary final output of "0" and the number of surviving states to a binary final output of "1", when path unification is not achieved.

59. A data-reproducing device, according to claim 52, wherein:
  to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
  a survival state at K clocks before can be judged from a survival path information corresponding to a data as to which of said two to the K-th power paths is selected;
  a L-bit previous clock data, where L>0 is to be satisfied, and path unification can be judged by tracking said survival state by clocks twice K to the past;
  a binary final output is given corresponding to said survival state where path unification is achieved; and a binary final output is given by deciding a majority between the number of surviving states to a binary final output of "0" and the number of surviving states to a binary final output of "1", when path unification is not achieved.

60. A data-reproducing device, according to claim 53, wherein:
- to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
- a survival state at K clocks before can be judged from a survival path information corresponding to a data as to which of said two to the K-th power paths is selected;
- a L-bit previous clock data, where L≧0 is to be satisfied, and path unification can be judged by tracking said survival state by clocks twice K to the past;
- a binary final output is given corresponding to said survival state where path unification is achieved; and
- a binary final output is given by deciding a majority between the number of surviving states to a binary final output of "0" and the number of surviving states to a binary final output of "1", when path unification is not achieved.

61. A data-reproducing device, according to claim 54, wherein:
- to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
- a survival state at K clocks before can be judged from a survival path information corresponding to a data as to which of said two to the K-th power paths is selected;
- a L-bit previous clock data, where L≧0 is to be satisfied, and path unification can be judged by tracking said survival state by clocks twice K to the past;
- a binary final output is given corresponding to said survival state where path unification is achieved; and
- a binary final output is given by deciding a majority between the number of surviving states to a binary final output of "0" and the number of surviving states to a binary final output of "1", when path unification is not achieved.

62. A data-reproducing device, according to claim 55, wherein:
- to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
- a survival state at K clocks before can be judged from a survival path information corresponding to a data as to which of said two to the K-th power paths is selected;
- a L-bit previous clock data, where L≧0 is to be satisfied, and path unification can be judged by tracking said survival state by clocks twice K to the past;
- a binary final output is given corresponding to said survival state where path unification is achieved; and
- a binary final output is given by deciding a majority between the number of surviving states to a binary final output of "0" and the number of surviving states to a binary final output of "1", when path unification is not achieved.

63. A data-reproducing device, according to claim 56, wherein:
- to all states, new temporary pathmetrics are calculated by adding a branchmetric over K clocks to a pathmetric at K clocks before as to two to the K-th power paths linking from K clocks before, where K>1 is to be satisfied, and one of said new temporary pathmetrics which has a smallest value is selected as a new pathmetric;
- a survival state at K clocks before can be judged from a survival path information corresponding to a data as to which of said two to the K-th power paths is selected;
- a L-bit previous clock data, where L≧0 is to be satisfied, and path unification can be judged by tracking said survival state by clocks twice K to the past;
- a binary final output is given corresponding to said survival state where path unification is achieved; and
- a binary final output is given by deciding a majority between the number of surviving states to a binary final output of "0" and the number of surviving states to a binary final output of "1", when path unification is not achieved.

64. A data-reproducing device, according to claim 1, wherein:
- said pre-equalization is conducted by using a PR(1) ternary value detection system, a detection system where a ternary waveform close to PR(1) is obtained, a PR(1,1) binary value detection system, a PR(1) binary value detection system, or a detection system where a binary waveform close to PR(1) is obtained.

65. A data-reproducing device, according to claim 51, wherein:
- said pre-equalization is conducted by using a PR(1) ternary value detection system, a detection system where a ternary waveform close to PR(1) is obtained, a PR(1,1) binary value detection system, a PR(1) binary value detection system, or a detection system where a binary waveform close to PR(1) is obtained.

66. A data-reproducing device, according to claim 57, wherein:
- said pre-equalization is conducted by using a PR(1) ternary value detection system, a detection system where a ternary waveform close to PR(1) is obtained, a PR(1,1) binary value detection system, a PR(1) binary value detection system, or a detection system where a binary waveform close to PR(1) is obtained.

67. A data-reproducing device, according to claim 1, wherein:
- an input data and an old RAM data with weights $\mu$, $\mu-1$, respectively are added, where $0 \leq \mu \leq 1$ is to be satisfied, and
- an optimum RAM data is obtained by renewing said old RAM data according to the addition result.

68. A data-reproducing device, according to claim 2, wherein:
- an input data and an old RAM data with weights $\mu$, $\mu-1$, respectively are added, where $0 \leq \mu \leq 1$ is to be satisfied, and
- an optimum RAM data is obtained by renewing said old RAM data according to the addition result.

69. A data-reproducing device, according to claim 3, wherein:
- an input data and an old RAM data with weights $\mu$, $\mu-1$, respectively are added, where $0 \leq \mu \leq 1$ is to be satisfied, and an optimum RAM data is obtained by renewing said old RAM data according to the addition result.

70. A data-reproducing device, according to claim 4, wherein:

an input data and an old RAM data with weights $\mu$, $\mu-1$, respectively are added, where $0 \leq \mu \leq 1$ is to be satisfied, and an optimum RAM data is obtained by renewing said old RAM data according to the addition result.

71. A data-reproducing device, according to claim 5, wherein:

an input data and an old RAM data with weights $\mu$, $\mu-1$, respectively are added, where $0 \leq \mu \leq 1$ is to be satisfied, and an optimum RAM data is obtained by renewing said old RAM data according to the addition result.

72. A data-reproducing device, according to claim 6, wherein:

an input data and an old RAM data with weights $\mu$, $\mu-1$, respectively are added, where $0 \leq \mu \leq 1$ is to be satisfied, and an optimum RAM data is obtained by renewing said old RAM data according to the addition result.

73. A data-reproducing device, according to claim 51, wherein:

an input data and an old RAM data with weights $\mu$, $\mu-1$, respectively are added, where $0 \leq \mu \leq 1$ is to be satisfied, and an optimum RAM data is obtained by renewing said old RAM data according to the addition result.

74. A data-reproducing device, according to claim 57, wherein:

an input data and an old RAM data with weights $\mu$, $\mu-1$, respectively are added, where $0 \leq \mu \leq 1$ is to be satisfied, and an optimum RAM data is obtained by renewing said old RAM data according to the addition result.

75. A data-reproducing device, according to claim 64, wherein:

an input data and an old RAM data with weights $\mu$, $\mu-1$, respectively are added, where $0 \leq \mu \leq 1$ is to be satisfied, and an optimum RAM data is obtained by renewing said old RAM data according to the addition result.

76. A data-reproducing device, according to claim 1, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

77. A data-reproducing device, according to claim 2, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

78. A data-reproducing device, according to claim 3, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

79. A data-reproducing device, according to claim 4, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

80. A data-reproducing device, according to claim 5, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

81. A data-reproducing device, according to claim 6, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

82. A data-reproducing device, according to claim 51, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

83. A data-reproducing device, according to claim 57, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

84. A data-reproducing device, according to claim 64, wherein:

a difference value where an old RAM data is subtracted from an input data is accumulated, and said RAM data is increased by one step when the accumulation result exceeds a + threshold value, or said RAM data is decreased by one step when the accumulation result is less than a − threshold value, to give an optimum RAM data.

\* \* \* \* \*